United States Patent
Shirakawa

(10) Patent No.: US 10,777,549 B2
(45) Date of Patent: Sep. 15, 2020

(54) SEMICONDUCTOR DEVICE

(71) Applicant: FUJI ELECTRIC CO., LTD., Kawasaki-shi, Kanagawa (JP)

(72) Inventor: Tohru Shirakawa, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/448,522

(22) Filed: Jun. 21, 2019

(65) Prior Publication Data

US 2019/0312029 A1    Oct. 10, 2019

Related U.S. Application Data

(63) Continuation of application No. PCT/JP2018/021772, filed on Jun. 6, 2018.

(30) Foreign Application Priority Data

Jul. 18, 2017   (JP) .................... 2017-139494

(51) Int. Cl.
*H01L 27/07* (2006.01)
*H01L 29/06* (2006.01)
(Continued)

(52) U.S. Cl.
CPC ...... *H01L 27/0716* (2013.01); *H01L 21/8234* (2013.01); *H01L 27/06* (2013.01);
(Continued)

(58) Field of Classification Search
CPC ..... H01L 27/0716; H01L 29/78; H01L 29/06; H01L 21/8234; H01L 29/739;
(Continued)

(56) References Cited

U.S. PATENT DOCUMENTS 8,080,853 B2 * 12/2011 Tsuzuki ............ H01L 27/0664
257/330
2001/0020720 A1 * 9/2001 Hueting ............ H01L 27/088
257/331

(Continued)

FOREIGN PATENT DOCUMENTS

| JP | 2013-138069 A | 7/2013 |
| JP | 2016-096222 A | 5/2016 |
| JP | 2017011171 A | 1/2017 |

*Primary Examiner* — Victor A Mandala
(74) *Attorney, Agent, or Firm* — Rabin & Berdo, P.C.

(57) ABSTRACT

An IGBT region in which an IGBT is disposed and a FWD region in which a FWD connected in antiparallel to the IGBT is disposed are provided in an active region of a semiconductor chip. In the active region, the FWD region is provided in plural separated from each other. The IGBT region is a continuous region between the FWD regions. In the IGBT region and the FWD region, first and second gate trenches are disposed in striped-shape layouts that are parallel to a front surface of the semiconductor chip and extend along a same first direction. The second gate trenches of the FWDs of the FWD regions are disposed separated from the first gate trenches of the IGBT in the IGBT region. This structure enables degradation of element characteristics to be prevented, and heat dissipation of the semiconductor chip and the degrees of freedom in design to be enhanced.

17 Claims, 13 Drawing Sheets

(51) Int. Cl.
*H01L 29/423* (2006.01)
*H01L 29/739* (2006.01)
*H01L 29/861* (2006.01)
*H01L 29/78* (2006.01)
*H01L 21/8234* (2006.01)
*H01L 27/06* (2006.01)
*H01L 23/34* (2006.01)

(52) U.S. Cl.
CPC .......... *H01L 29/06* (2013.01); *H01L 29/0611* (2013.01); *H01L 29/4236* (2013.01); *H01L 29/739* (2013.01); *H01L 29/7397* (2013.01); *H01L 29/78* (2013.01); *H01L 29/8611* (2013.01); *H01L 23/34* (2013.01)

(58) Field of Classification Search
CPC . H01L 27/06; H01L 29/0611; H01L 29/4236; H01L 29/7397; H01L 29/8611; H01L 23/34; H01L 29/417; H01L 27/0248; H01L 29/1095; H01L 29/0696; H01L 27/0727; H01L 29/407; H01L 29/8613
See application file for complete search history.

(56) References Cited

U.S. PATENT DOCUMENTS

| | | |
|---|---|---|
| 2008/0135871 A1 | 6/2008 | Ruething et al. |
| 2012/0043581 A1* | 2/2012 | Koyama ............ H01L 29/8613 257/140 |
| 2014/0084336 A1* | 3/2014 | Matsudai ............ H01L 29/861 257/140 |
| 2015/0008480 A1 | 1/2015 | Ruething et al. |
| 2016/0141400 A1* | 5/2016 | Takahashi ........... H01L 29/0834 257/140 |
| 2017/0236908 A1* | 8/2017 | Naito ................. H01L 29/4238 257/48 |
| 2017/0236926 A1* | 8/2017 | Imagawa ........... H01L 29/0696 257/144 |
| 2018/0166279 A1* | 6/2018 | Tamura .............. H01L 29/4236 |
| 2018/0308757 A1* | 10/2018 | Kakimoto ............. H01L 29/78 |
| 2019/0148364 A1* | 5/2019 | Kono ................. H01L 29/0619 257/140 |
| 2019/0362975 A1* | 11/2019 | Mukai ................ H01L 29/8613 |

* cited by examiner

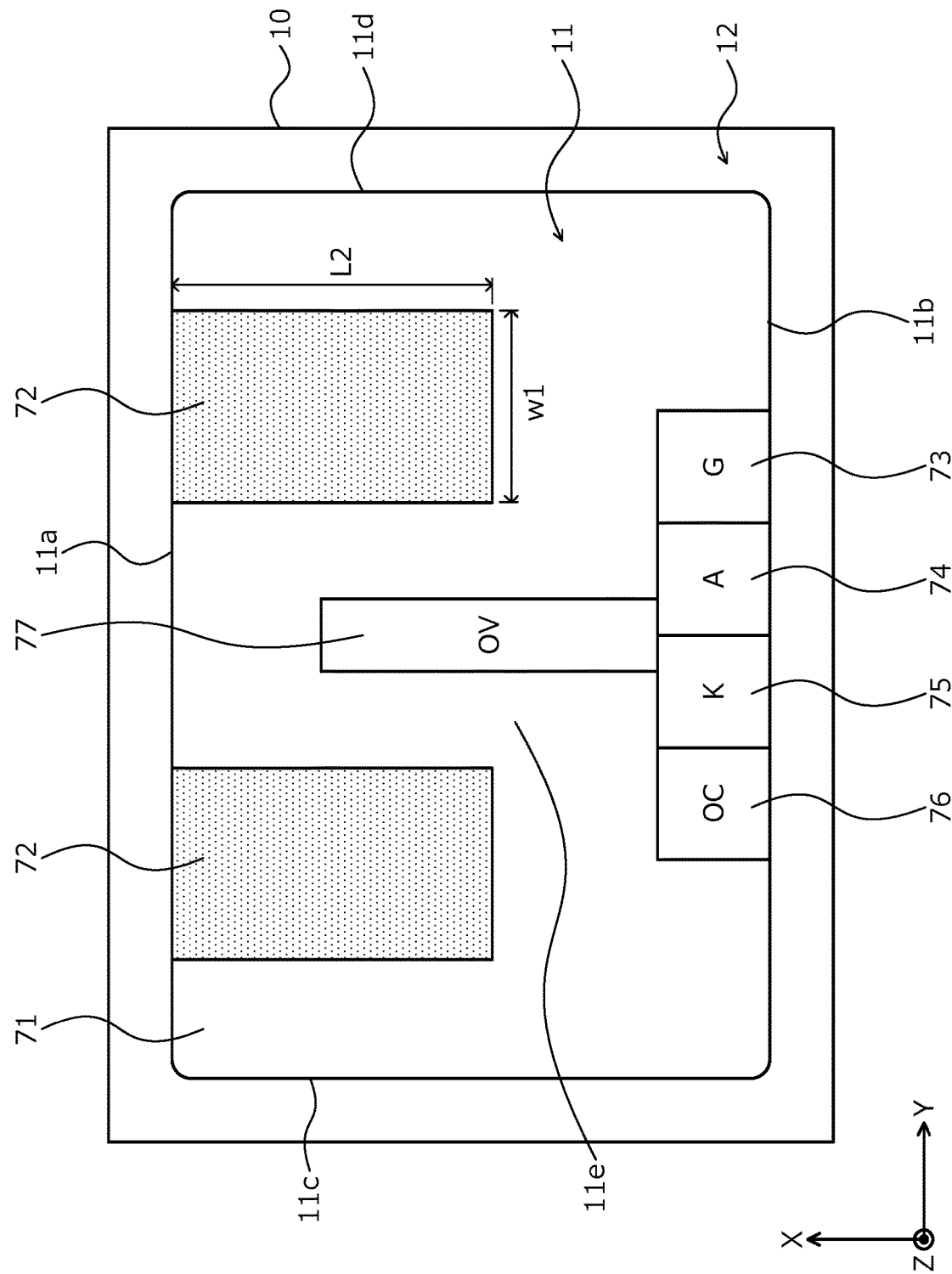

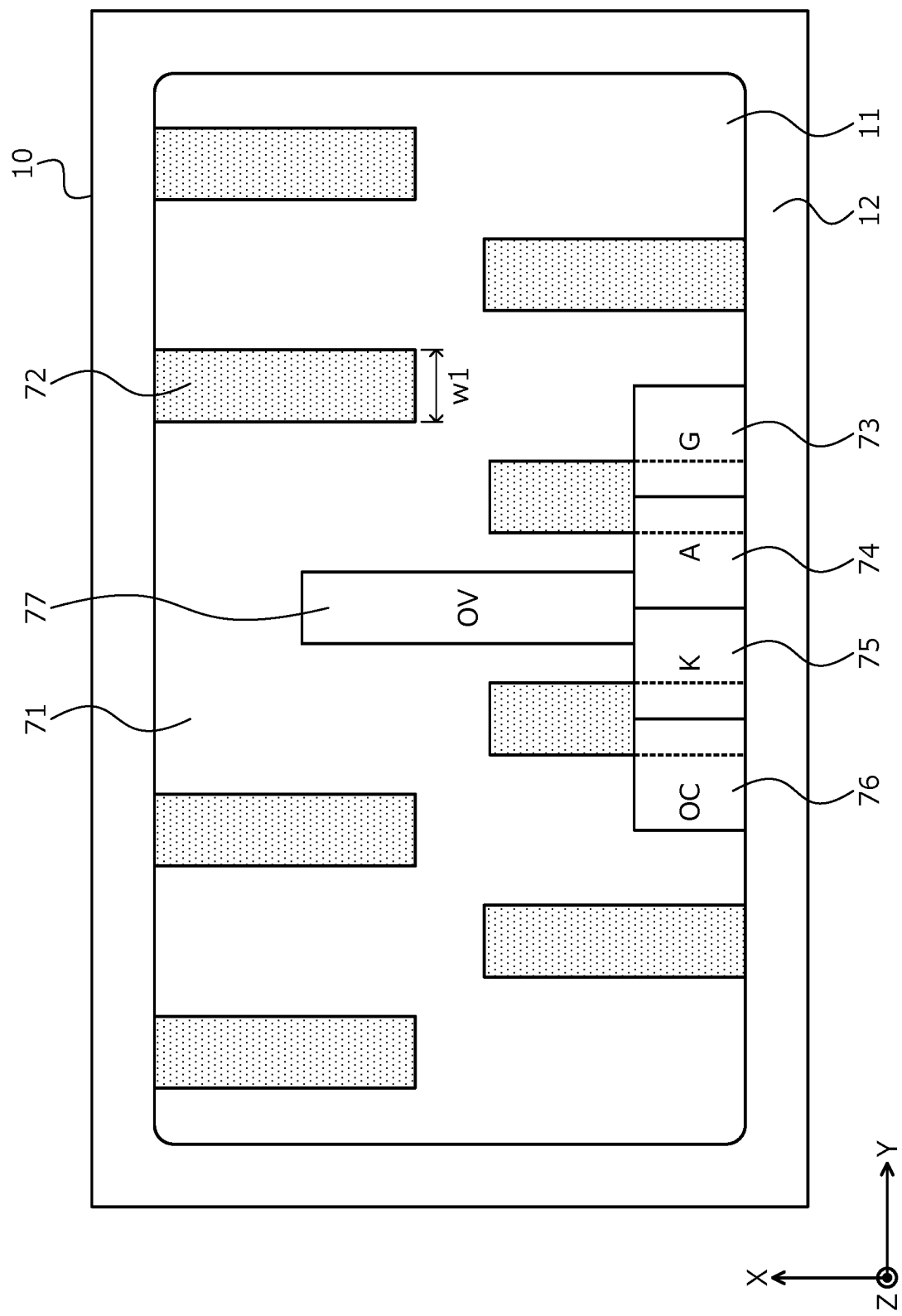

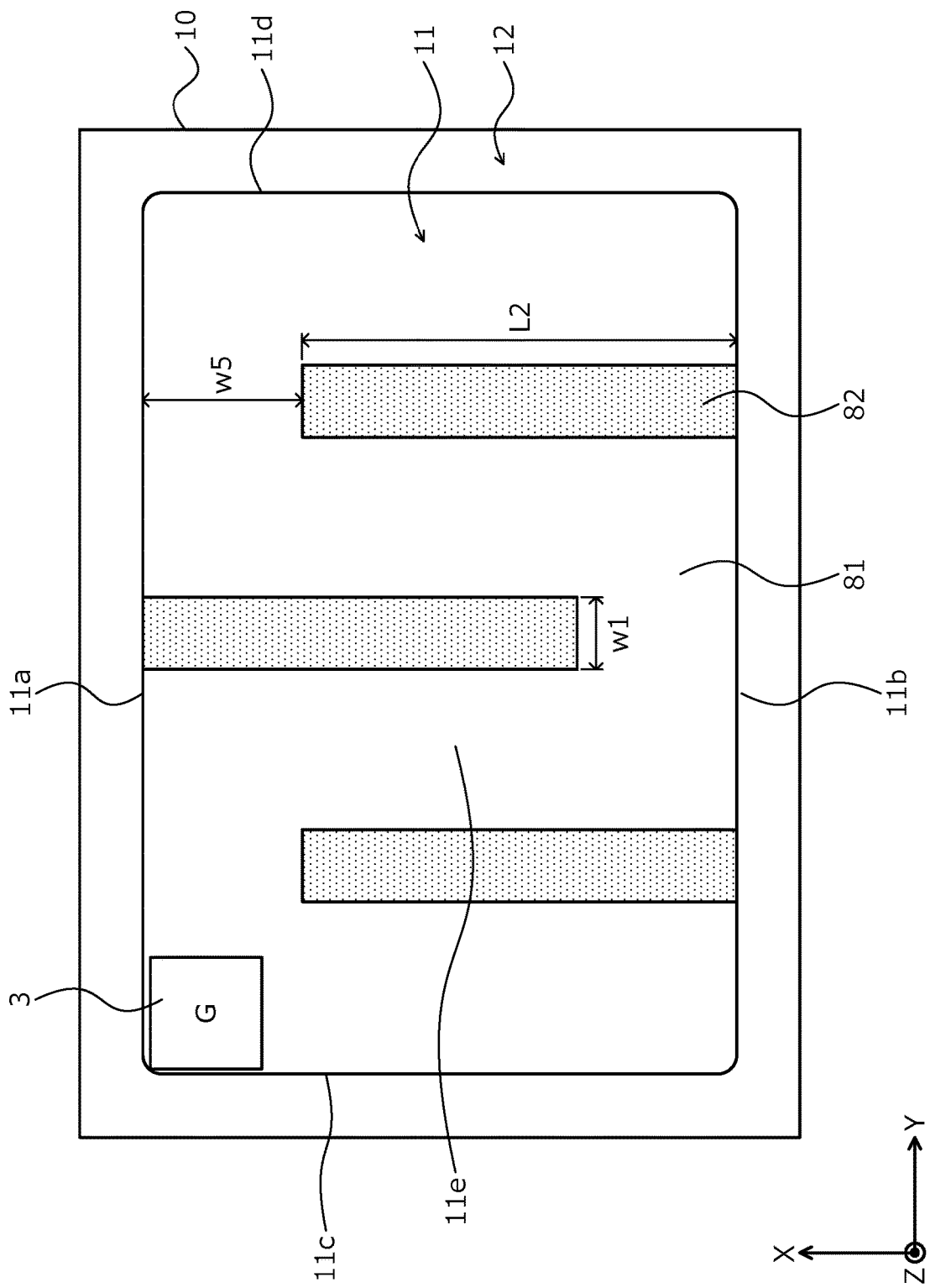

SEMICONDUCTOR DEVICE

CROSS REFERENCE TO RELATED APPLICATIONS

This is a continuation application of International Application PCT/JP2018/021772 filed on Jun. 6, 2018 which claims priority from a Japanese Patent Application No. 2017-139494 filed on Jul. 18, 2017, the contents of which are incorporated herein by reference.

BACKGROUND OF THE INVENTION

1. Field of the Invention

Embodiments of the invention relate to a semiconductor device.

2. Description of the Related Art

Conventionally, reverse conducting insulated gate bipolar transistors (RC-IGBTs) in which an IGBT and a free wheeling diode (FWD) are integrated on a single semiconductor chip are commonly known. In a RC-IGBT, a region (hereinafter, FWD region) in which the FWD is disposed is disposed in a layout that has a striped shape as viewed from a front surface of the semiconductor chip.

A layout (hereinafter, planar layout) of the FWD region of a conventional RC-IGBT, as viewed from the front surface of the semiconductor chip will be described. FIGS. 11 and 12 are plan views of examples of a planar layout of a conventional semiconductor device. FIG. 11 depicts an example (hereinafter, small-chip IGBT) in which an IGBT and a FWD are disposed on a semiconductor chip 110a. FIG. 12 depicts an example in which a FWD is disposed on a single semiconductor chip 110b having an IGBT (hereinafter, sense IGBT) for detecting/controlling current and chip temperature.

The conventional semiconductor devices depicted in FIGS. 11 and 12 have an IGBT region 101 and a FWD region 102 in an active region 111. The IGBT region 101 is a region in which an IGBT is disposed and is a region that is region other than the FWD region 102 in the active region 111. A sum of a surface area of the IGBT region 101 and a surface area of the FWD region 102 is equal to a surface area of the active region 111. The FWD region 102 is disposed in a striped-shape layout and both ends thereof reach a boundary between the active region 111 and an edge termination region 112. In other words, a length (length of a longitudinal direction) L102 of the FWD region 102 is substantially equal to a length L101 of one side of the active region 111 that has a substantially rectangular planar shape, the one side being parallel to a direction of the stripe of the FWD region 102.

Unit cells (configuration units of an element) of the IGBT of the IGBT region 101 are disposed separated into plural regions by the FWD region 102. Further, in the active region 111, a gate pad (electrode pad) 103, electrode pads of sense pads 104 to 107 for current/temperature sensing, etc. are disposed. FIG. 11 depicts a case in which the gate pad 103 is disposed near one vertex of the active region 111. FIG. 12 depicts a case in which the sense pad 107 is disposed near a center, and the gate pad 103 and the sense pads 104 to 106 are disposed along one side of the active region 111, the one side being orthogonal to the stripe of the FWD region 102.

As a conventional RC-IGBT, a device has been proposed in which four diode regions are disposed in a matrix-shaped planar layout and an IGBT region is disposed so as to surround the four diode regions (for example, refer to Japanese Laid-Open Patent Publication No. 2016-096222 (paragraph 0012, FIGS. 1, 2, 8, 10)). In Japanese Laid-Open Patent Publication No. 2016-096222, a gate trench of the IGBT region and a gate trench of the diode region are each disposed in a striped shape on a same stripe, separated from each other along a direction that the stripe extends and respective ends thereof oppose each other across a p-type well layer.

Further, as another example of a conventional RC-IGBT, a device has been proposed in which a non-active region not functioning as an active region is disposed between plural IGBT regions and plural diode regions so as to be orthogonal to the plural diode regions and the plural IGBT regions having a strip-like shape (for example, refer to Japanese Laid-Open Patent Publication No. 2013-138069 (paragraph 0067, FIGS. 1, 2)). In Japanese Laid-Open Patent Publication No. 2013-138069, along a direction in which diode cell regions extend in a striped shape, the diode cell regions are disposed separated from each other and the respective ends thereof oppose each other across a non-active region.

SUMMARY OF THE INVENTION

According to an embodiment, a semiconductor device includes a semiconductor substrate; and an active region through which current flows, provided on the semiconductor substrate, the active region including a first element region and a plurality of second element regions. The first element region includes a first element having a first trench gate structure, the first trench gate structure including a first trench provided on a first main surface side of the semiconductor substrate, and a first gate electrode provided in the first trench via a first gate insulating film. The plurality of second element regions each include a second element having a second trench gate structure, the second trench gate structure including a second trench provided on the first main surface side of the semiconductor substrate, separated from the first trench, and a second gate electrode provided in the second trench via a second gate insulating film. The first element region is a single continuous region in which the plurality of second element regions are disposed, the second element regions being spaced apart from each other.

In the embodiment, each second element region is disposed near an outer periphery of the active region.

In the embodiment, the active region has a rectangular outer periphery including a first side extending in a first direction and a second side opposite to the first side. Each second element region is disposed in a striped-shape layout that is parallel to a first main surface of the semiconductor substrate. The plurality of second element regions include a plurality of first second-element-regions and a plurality of second second-element-regions, the first second-element-regions extending from the first side toward the second side in the first direction, the second second-element-regions extending from the second side toward the first side in the first direction, each of the first second-element-regions being disposed at a position different from each of the second second-element-regions along a second direction orthogonal to the first direction, a total number of the first second-element-regions and a total number of the second second-element-regions are the same.

In the embodiment, a first length of said each second element region along the first direction is longer than a second length of said each second element region along the second direction.

In the embodiment, a distance between adjacent two second element regions in the second direction is equal to or greater than the second length of said each second element region along the second direction.

In the embodiment, the second length of said each second element region along the second direction is at least 50 µm.

In the embodiment, the first element further includes a first semiconductor region of a first conductivity type provided on the semiconductor substrate; a second semiconductor region of a second conductivity type provided in a surface layer at the first main surface of the semiconductor substrate, the second semiconductor region being in contact with the first semiconductor region; a third semiconductor region of the first conductivity type selectively provided in the second semiconductor region; a fourth semiconductor region of the second conductivity type provided in a surface layer at a second main surface of the semiconductor substrate, the fourth semiconductor region being in contact with the first semiconductor region; a first electrode in contact with the second semiconductor region and the third semiconductor region; and a second electrode in contact with the fourth semiconductor region. The first trench penetrates the third semiconductor region and the second semiconductor region, and reaches the first semiconductor region. The second element further includes the first semiconductor region and the second semiconductor region extending from the first element region to said each second element region; a fifth semiconductor region of the first conductivity type provided in the surface layer at the second main surface of the semiconductor substrate, the fifth semiconductor region being in contact with the first semiconductor region and the fourth semiconductor region; the first electrode in contact with the second semiconductor region; and the second electrode in contact with the fifth semiconductor region. The second trench penetrates the second semiconductor region and reaches the first semiconductor region. The second gate electrode is in contact with the fifth semiconductor region.

In the embodiment, the first trench includes a plurality of first trenches each having two ends, each first trench extending in a direction parallel to the first main surface of the semiconductor substrate and being disposed in a striped-shape layout extending in the first direction. The second trench includes a plurality of second trenches each having two ends, each second trench extending in a direction parallel to the first main surface of the semiconductor substrate and being disposed in a striped-shape layout extending in the first direction. One of the two ends of one of the first trenches facing one of the two ends of a corresponding one of the second trenches along the first direction. The semiconductor device further includes a sixth semiconductor region of the second conductivity type provided between and contacting the one of the two end of the one of the first trenches and the one of the two ends of the corresponding one of the second trenches.

In the embodiment, the first trench includes a plurality of first trenches each having two ends, each first trench extending in a direction parallel to the first main surface of the semiconductor substrate and being disposed in a striped-shape layout extending in the first direction. The second trench includes a plurality of second trenches each having two ends, each second trench extending in a direction parallel to the first main surface of the semiconductor substrate and being disposed in a striped-shape layout extending in the first direction. One of the two ends of one of the first trenches facing one of the two ends of a corresponding one of the second trenches along the first direction. The semiconductor device further includes a sixth semiconductor region of the second conductivity type provided between and contacting the one of the two end of the one of the first trenches and the one of the two ends of the corresponding one of the second trenches.

In the embodiment, a depth of the sixth semiconductor region is greater than a depth of the first trench and a depth of the second trench.

In the embodiment, the semiconductor device further includes a boundary region between the first element region and one of the second element regions. The boundary region includes the first semiconductor region having a surface layer in which the second semiconductor region is disposed.

In the embodiment, the second semiconductor region in the boundary region further includes a seventh semiconductor region of the second conductivity type disposed in the surface layer of the second semiconductor region, the seventh semiconductor region having an impurity concentration higher than an impurity concentration of the second semiconductor region; and an eighth semiconductor region of the first conductivity type disposed at a bottom surface of the second semiconductor region, the eighth semiconductor region having an impurity concentration higher than an impurity concentration of the first semiconductor region.

In the embodiment, the seventh semiconductor region is electrically connected to the second gate electrode.

In the embodiment, the semiconductor device further includes a boundary region between the first element region and one of the second element regions. The boundary region further includes the sixth semiconductor region, the six semiconductor region being provided in the surface layer of the first semiconductor region and covering bottoms of the first trench and a corresponding one of the second trenches, and a ninth semiconductor region of the second conductivity type provided in a surface layer of the sixth semiconductor region, the ninth semiconductor region having an impurity concentration higher than an impurity concentration of the sixth semiconductor region.

In the embodiment, the ninth semiconductor region is electrically connected to the second gate electrode.

In the embodiment, the semiconductor device further includes an edge termination region provided between the active region and an edge of the semiconductor substrate in plan view of the semiconductor device, the edge termination region surrounding a periphery of the active region. The active region has a rectangular outer periphery including a first pair of opposing sides in a first direction and a second pair of opposing sides in a second direction orthogonal to the first direction. Each second element region is disposed in a striped-shape layout that is parallel to a first main surface of the semiconductor substrate, and extends from one of the first pairs of opposing sides toward the other one of the first pair of opposing sides along the second direction. The outer periphery of the active region is a boundary between the active region and the edge termination region.

In the embodiment, the semiconductor device further includes an edge termination region provided between the active region and an edge of the semiconductor substrate in plan view of the semiconductor device, the edge termination region surrounding a periphery of the active region. The active region has a rectangular outer periphery including a first pair of opposing sides in a first direction and a second pair of opposing sides in a second direction orthogonal to the first direction. Each second element region is disposed in a striped-shape layout that is parallel to a first main surface of the semiconductor substrate, and extends from one of the first pairs of opposing sides toward the other one of the first pair of opposing sides along the second direction. The outer periphery of the active region is a boundary between the active region and the edge termination region.

In the embodiment, the first element region is an insulated gate bipolar transistor, and each of the plurality of second element regions is a free wheeling diode.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 8 is a plan view depicting a planar layout of the semiconductor device according to a third embodiment.

FIG. 9 is a plan view depicting a planar layout of the semiconductor device according to a fourth embodiment.

FIG. 10 is a plan view depicting a planar layout of the semiconductor device according to a fifth embodiment.

DETAILED DESCRIPTION OF THE INVENTION

Figure 11:
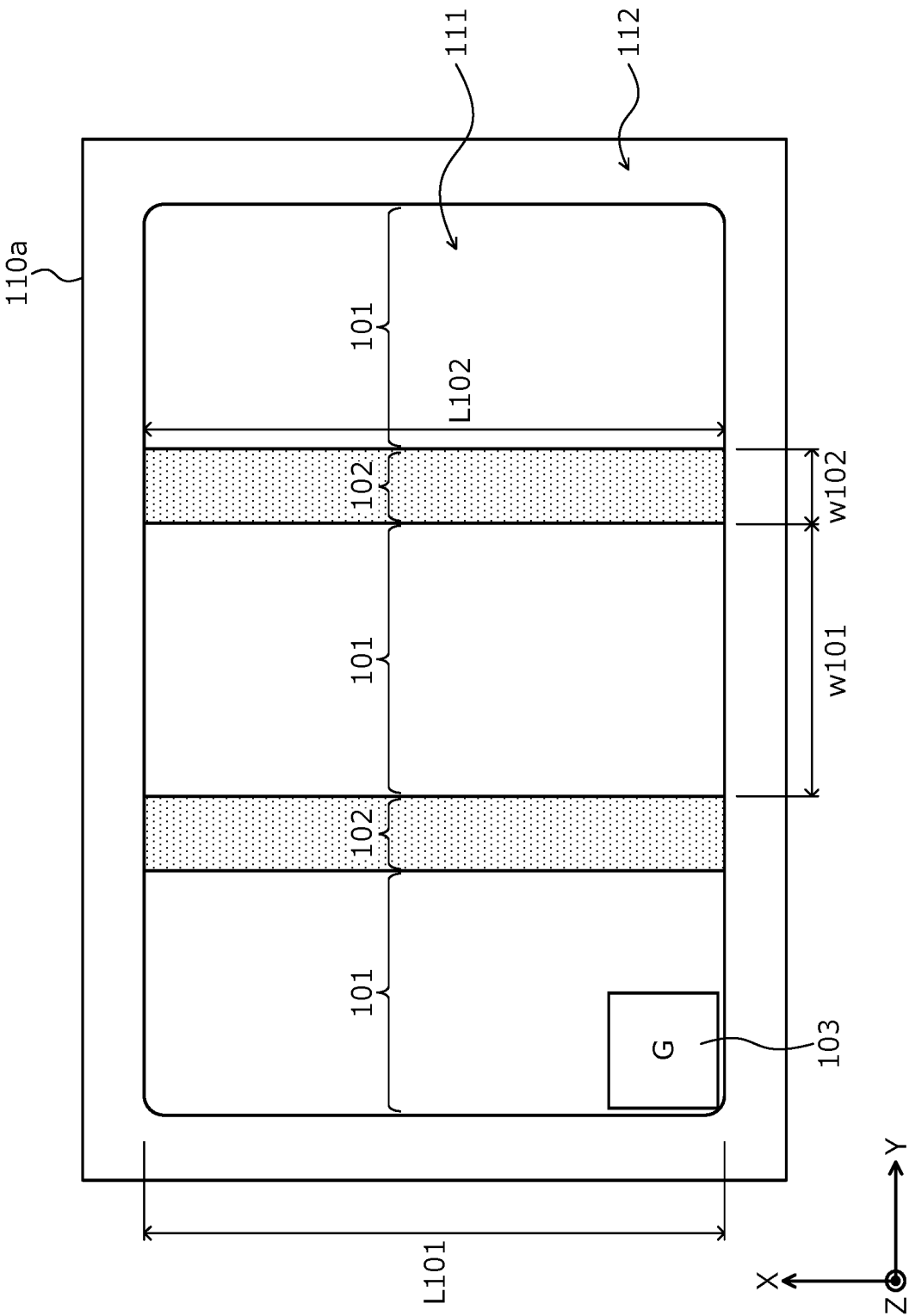
FIG. 11 is a plan view of an example of a planar layout of a conventional semiconductor device.

To suppress temperature increases of the semiconductor chip $110a$, the FWD region 102 is disposed in the active region 111 in greater number, whereby a difference in temperature of the IGBT region 101 and the FWD region 102 is eliminated and therefore, desirable. However, with the conventional RC-IGBT, in the case of a small-chip IGBT (refer to FIG. 11), only about one or two of the FWD regions 102 can be disposed in the active region 111. Therefore, a problem arises in that heat dissipation of the semiconductor chip disappears. Thus, when heat dissipation of the semiconductor chip is optimized and a mathematical area of the FWD region 102 is adjusted, a width w102 of the FWD region 102 is decreased by the mathematical area of the FWD region 102 and the mathematical area by which the width w102 of the FWD region 102 is decreased has to be used to increase the number of the FWD regions 102 disposed. Nonetheless, when the width w102 of the FWD region 102 is too narrow, a problem arises in that forward characteristics of the FWD degrade during application of gate voltage of 15V or higher, which is a typical IGBT gate threshold voltage. On the other hand, even in a case of a larger chip size, when the mathematical area of the FWD region 102 is adjusted, the width w102 of the FWD region 102 has to be reduced and problems similar to those of the small-chip IGBT arise.

Further, in the case of the sense IGBT (refer to FIG. 12), the FWD region 102 is in contact with the gate pad 103 and therefore, the planar layout of the FWD region 102 has to be adjusted. Further, in a portion where the electrode pad is disposed, a width w101 of the IGBT region 101 decreases. Additionally, similarly to the small-chip IGBT, the width w102 of the FWD region 102 is also narrow. Therefore, problems arise in that a structure is formed in which electron current of the IGBT easily passes to the FWD region 102, mutual interference occurs at the boundary between the IGBT and the FWD, and element characteristics degrade.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
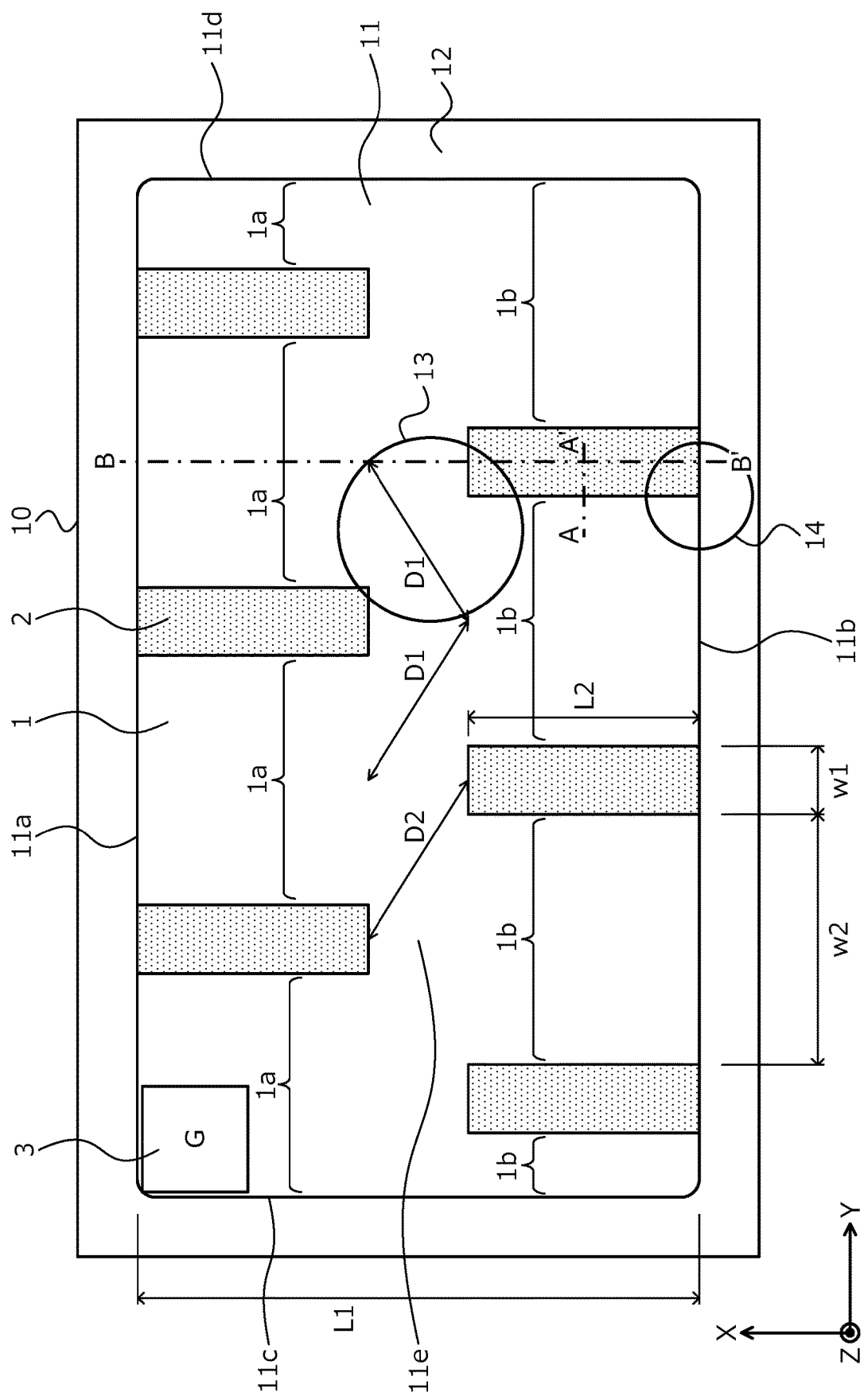
FIG. 1 is a plan view depicting a planar layout of a semiconductor device according to a first embodiment.

A structure of the semiconductor device according to a first embodiment will be described. FIG. 1 is a plan view depicting a planar layout of the semiconductor device according to the first embodiment. A planar layout is a planar shape and arrangement of regions as viewed from a chip front surface (front surface of a semiconductor chip (semiconductor substrate) 10). In FIG. 1, IGBT and FWD element structures respectively disposed in an IGBT region 1 and a FWD region 2 are not depicted. Further, in FIG. 1, while the semiconductor chip 10 is depicted having a substantially rectangular planar shape (similarly in FIGS. 8 to 10), the planar shape of the semiconductor chip 10 may be square.

Figure 2:
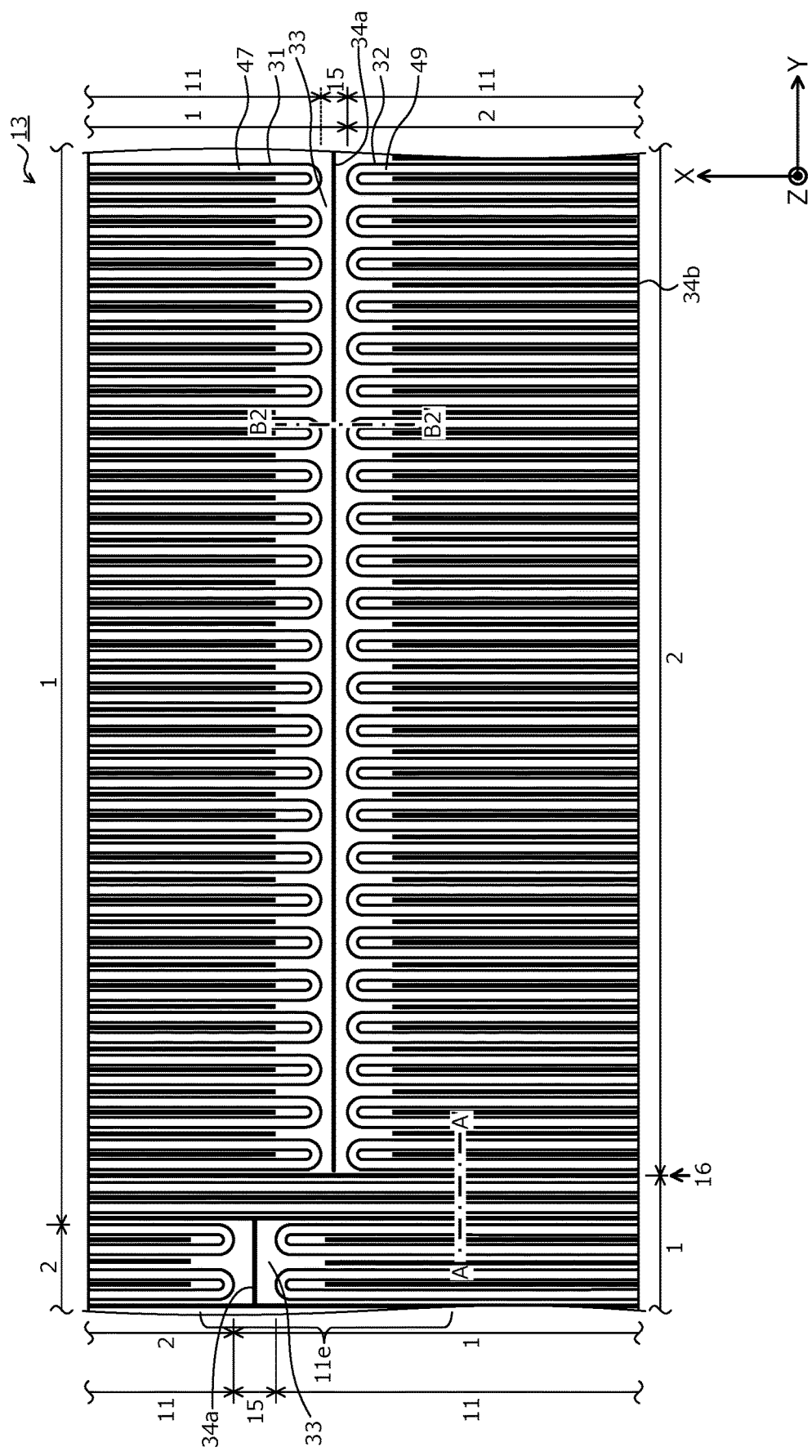
FIG. 2 is a plan view depicting an enlarged view of a portion of FIG. 1.
Figure 3:
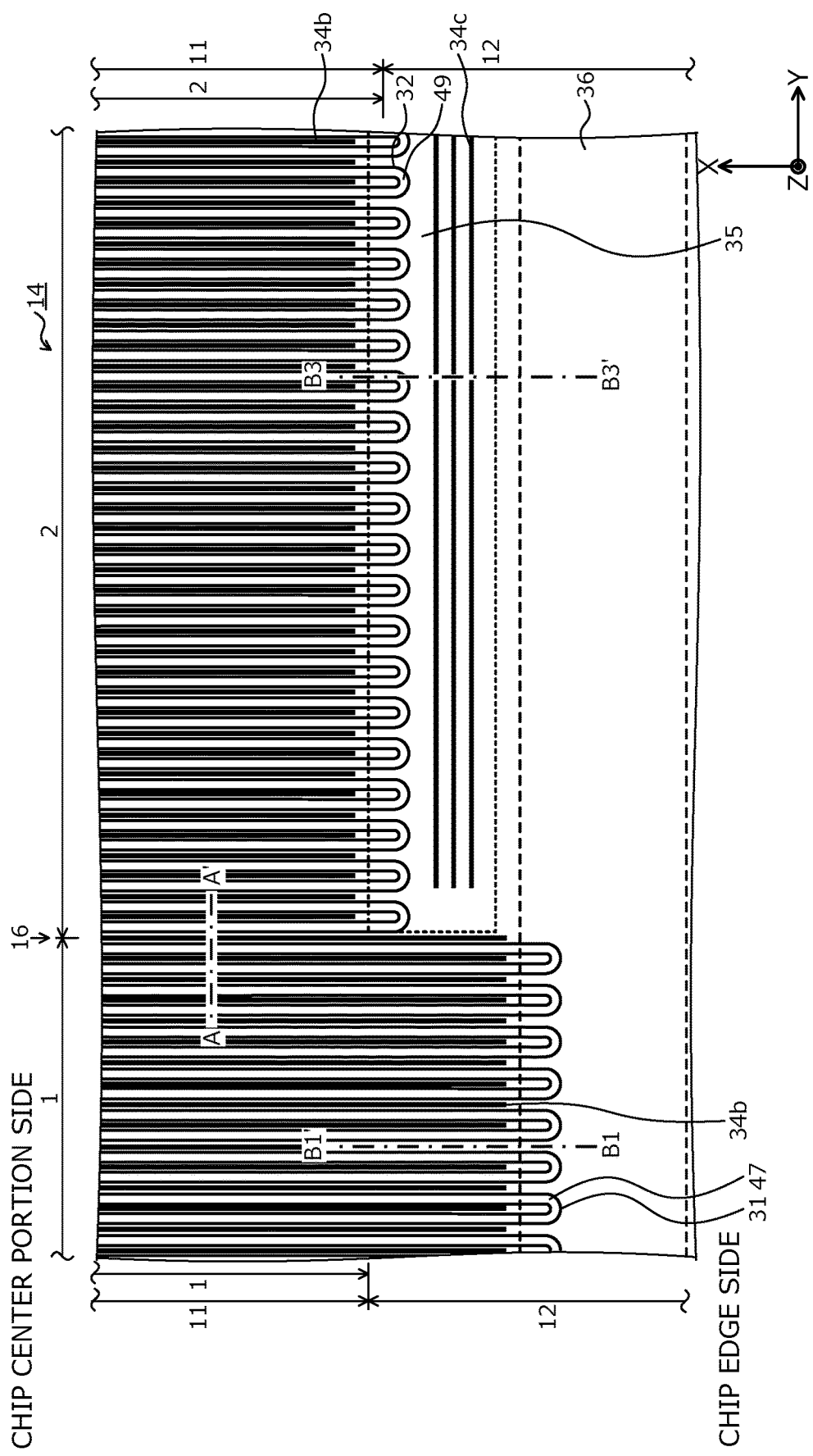
FIG. 3 is a plan view depicting an enlarged view of a portion of FIG. 1.

FIGS. 2 and 3 are plan views depicting an enlarged view of portions of FIG. 1. In FIGS. 2 and 3, gate insulating films 46 in first and second gate trenches 31, 32, an interlayer insulating film 50 on the chip front surface are not depicted to clearly depict arrangement of the first and the second gate trenches 31, 32 respectively disposed in the IGBT region 1 and the FWD region 2. FIG. 2 depicts a vicinity 13 of a boundary between the IGBT region 1 and the FWD region 2, near a center portion 11e of an active region 11. FIG. 3 depicts the IGBT region 1 and the FWD region 2 at a vicinity 14 of a boundary between the active region 11 and an edge termination region 12.

A planar layout of the semiconductor device according to the first embodiment will be described. The semiconductor device according to the first embodiment and depicted in FIG. 1 is a reverse conducting IGBT (RC-IGBT) having a structure in which an insulated gate bipolar transistor (IGBT) and a free wheeling diode (FWD) that is connected in antiparallel to the IGBT are built into and integrated in the same semiconductor chip 10; and has the IGBT region 1 and the FWD region 2 in the active region 11.

The active region 11 is a region through which current flows in an ON state (responsible for current driving). The active region 11, for example, has a substantially rectangular planar shape. A periphery of the active region 11 is surrounded by the edge termination region 12. The edge termination region 12 is a region between the active region 11 and a chip edge of the semiconductor chip 10, and is a region for sustaining breakdown voltage (withstand voltage) of the chip overall by passing an equipotential line arising from an n⁻-type drift region (first semiconductor region) 41 (refer to FIGS. 4 and 5) and a p-type base region (second semiconductor region) 42 of the active region 11, via the edge termination region 12 and for mitigating electric field of a chip front surface side. The breakdown voltage is the voltage when the electric field of the chip front surface side becomes strong and avalanche current is generated.

In the edge termination region 12, for example, a general breakdown voltage structure (not depicted) such as a field limiting ring (FLR) is provided. The IGBT region 1 is a region in which the IGBT is disposed and is a region of the active region 11, other than the FWD region 2. In other words, a sum of a surface area of the IGBT region 1 and a surface area of the FWD region 2 is equal to a surface area of the active region 11. FIGS. 2 and 3 depict plural unit cells (configuration units of an element) of the IGBT disposed in parallel in the IGBT region 1 and plural unit cells of the FWD disposed in parallel in the FWD region 2 (similarly in FIGS. 4 and 5).

The FWD region 2 is a region in which the FWD is disposed. The FWD region 2, for example, has a rectangular planar shape and is disposed in plural separated from one another. The number of the FWD regions 2 may be determined by a ratio of the surface areas of the IGBT region 1 and the FWD region 2 in the active region 11. The plural FWD regions 2 may be dispersed in the active region 11 overall. A reason for this is as follows. As a characteristic of a RC-IGBT, the IGBT region 1 and the FWD region 2 are disposed adjacent to each other. Therefore, heat generated from the IGBT region 1 and the FWD region 2 may be divided between the IGBT region 1 and the FWD region 2. As a result, the generated heat may be suppressed to a greater extent than by the IGBT region 1 and the FWD region 2 alone. The FWD region 2 has a high current density as compared to the IGBT region 1 because the surface area may be decreased. However, while the generated heat is divided in this RC-IGBT structure, due to the widths and number of the IGBT regions 1 and the FWD regions 2, differences in the amount of heat generated occur and a problem arises in that the temperature of the semiconductor chip 10 easily increases. Thus, by dispersing the plural FWD regions 2, as compared to an instance in which one FWD region 2 is disposed, the heat generated by the FWD regions 2 may be suppressed.

Figure 6A:
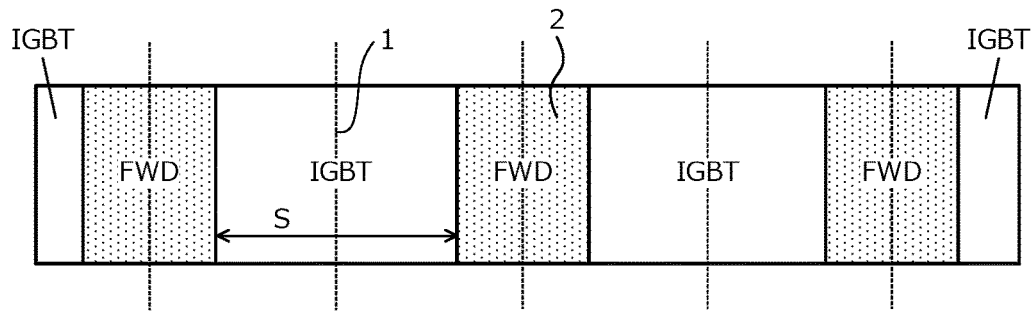
FIG. 6A depicts widths of an IGBT region and a FWD region.
Figure 6B:
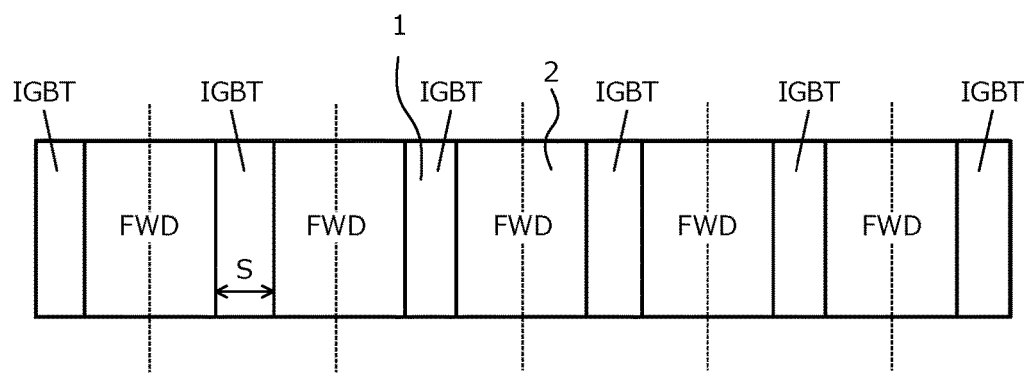
FIG. 6B depicts other widths of the IGBT region and the FWD region.
Figure 6C:
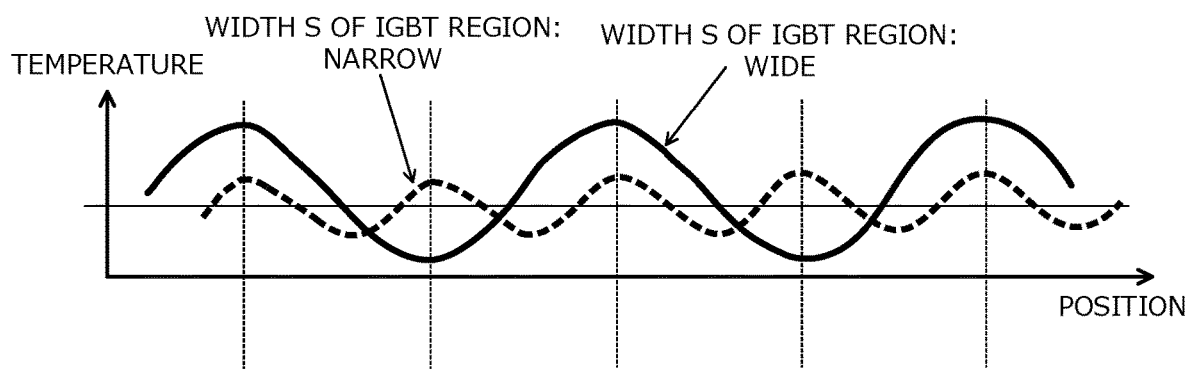
FIG. 6C depicts temperature amplitude according to the widths of the IGBT region and the FWD region in FIGS. 6A and 6B.

FIGS. 6A, 6B, and 6C are diagrams depicting temperature amplitude and widths of the IGBT region and the FWD region. FIGS. 6A, 6B, and 6C depict temperature amplitude according to widths of the IGBT region 1 and the FWD region 2. FIG. 6A depicts an instance in which a width S of the IGBT region 1 is wider than the width of the FWD region 2. FIG. 6B depicts an instance in which the width S of the IGBT region 1 is narrower than the width of the FWD region 2. FIG. 6C depicts temperature in the instances depicted in FIG. 6A and FIG. 6B. In FIGS. 6A and 6B, dotted lines indicate positions of dotted line segments depicted in FIG. 6C. A trend is shown in which the temperature at a center portion of the FWD region 2 is high while the temperature at a center portion of the IGBT region 1 is low.

From the results depicted in FIG. 6C, for example, when the width S of the IGBT region 1 is wider than the width of the FWD region 2 (the number of the FWD regions 2 is low), a temperature difference easily occurs between the IGBT region 1 and the FWD region 2 and therefore, the amplitude indicating the temperature difference easily increases. Therefore, heat is easily generated at the FWD region 2. On the contrary, when the width S of the IGBT region 1 is narrower than the width of the FWD region 2 (the number of the FWD regions 2 is large), a distance between the FWD regions 2 decreases, whereby the temperature difference decreases, enabling the generated heat of the FWD region 2 to be suppressed. The distance (the width S of the IGBT region 1) between the FWD regions 2 at this time may be 50% or more of the width of the FWD region 2. A reason for this is that when the width S of the IGBT region 1 is narrow, a snapback phenomenon of conductance loss occurs easily. However, in actuality, the chip size of the semiconductor chip 10 is determined and when it is not desirable to change the surface area ratio of the IGBT region 1 and the FWD region 2, the number of the FWD regions 2 may be increased. Thus, as described above (refer to FIG. 1), disposal of the IGBT region 1 and the FWD region 2 enables the number of the FWD regions 2 in the semiconductor chip 10 to be increased. On the other hand, when only the heat dissipation is to be enhanced, the width of the FWD region 2 may be decreased and the mathematical area thereof may be used to increase the number of the FWD regions 2.

Further, the plural FWD regions 2 may be disposed at equal intervals. A reason for this is as follows. Because the IGBT and the FWD operate alternately, the timings at which heat is generated by the IGBT region 1 and the FWD region 2 differ by 1 period. Therefore, the plural FWD regions 2 are disposed at substantially equal intervals, whereby the heat may be more easily distributed between the IGBT region 1 and the FWD region 2 mutually, enabling the generated heat of the semiconductor chip 10 overall to be substantially uniform in a plane of the semiconductor chip 10.

Further, a length L2 of the FWD region 2 may be shortened and the FWD region 2 may be disposed as near to the boundary between the active region 11 and the edge termination region 12 as possible. A reason for this is as follows. On the front surface of the semiconductor chip 10, as described hereinafter, a polysilicon layer 35 is disposed so as to cover an end of the second gate trench 32 disposed in the FWD region 2, the end nearest the edge termination region 12. Therefore, unevenness due to the polysilicon layer 35 occurs at an element surface (a surface of a front electrode (first electrode) 51 described hereinafter, refer to FIG. 4). When a bonding wire (or an external connection terminal, not depicted) is bonded to an uneven portion occurring due to the polysilicon layer 35, breaks or cracks may occur in the front electrode 51. Therefore, the FWD region 2 may be disposed toward the boundary between the active region 11 and the edge termination region 12 and the unevenness due to the polysilicon layer 35 may be disposed as near to the chip edge as possible. As a result, for example, a flat surface of a center portion (the center portion 11e of the active region 11) of the semiconductor chip 10 where the bonding wire is bonded may be widened. Therefore, a diameter of the bonding wire may be increased and contact resistance may be reduced.

In particular, the plural FWD regions 2 are disposed in a striped planar layout extending toward the center portion 11e of the active region 11, from a pair of opposing sides (long sides) 11a, 11b constituting an outer periphery of the active region 11, and extend parallel to another pair of sides (short sides) 11c, 11d that constitute the outer periphery of the active region 11 and are orthogonal to the sides 11a, 11b. The sides 11a to 11d of the active region 11 are the boundary between the active region 11 and the edge termination region 12. In FIG. 1, long sides of the active region 11 disposed in a substantially rectangular planar shape are the sides 11a, 11b while short sides thereof are the sides 11c, 11d.

The FWD regions 2 at the side 11a and the FWD regions 2 at the side 11b of the pair of opposing sides 11a, 11b of the active region 11 are disposed at mutually different positions and do not oppose each other along a direction (longitudinal direction of stripe, hereinafter, first direction) X in which the FWD regions 2 extend in the striped shape. Therefore, even when the plural FWD regions 2 are dispersed in the active region 11, all of the gate electrodes (not depicted) disposed in a striped planar layout in the IGBT region 1 are connected to a gate runner (not depicted), at an end of the corresponding gate trench (not depicted). Further, the number of the FWD regions 2 in contact with each of the one pair of opposing sides 11a, 11b may be equal. A reason for this is that when bonding wire is connected to a center of the semiconductor chip 10 and the number of the FWD regions 2 differ, current tends to concentrate at the side 11a, 11b having fewer of the FWD regions 2, whereby heat dissipation may degrade.

Further, the FWD regions 2 may extend along the first direction X by the length (length extending along the first direction X (longitudinal direction)) L2 that from the sides 11a, 11b of the active region 11, does not reach the center portion 11e of the active region 11. In other words, the length L2 of the FWD regions 2 is less than half of a length L1 of the sides 11c, 11d that are parallel to the striped FWD regions 2 of the active region 11 (L2<L1/2). In this case, the FWD regions 2 at the side 11a of the active region 11 and the FWD regions 2 at the side 11b do not oppose each other along a direction (hereinafter, second direction) Y orthogonal to the first direction X.

In this manner, the length L2 of the FWD regions 2 is shortened, portions 1a of the IGBT region 1 between the FWD regions 2 at the side 11a of the active region 11 and portions 1b between the FWD regions 2 at the side 11b are separated from each other by a distance D1 in a direction that is oblique to the first direction X. Additionally, the FWD regions 2 at the side 11a of the active region 11 and the FWD regions 2 at the side 11b are separated from each other by a distance D2 in a direction that is oblique to the first direction X. As a result, the distances D1, D2 may be increased as compared to a case in which the FWD regions 2 oppose each other along the first direction X. As a result, characteristics degradation due to the snapback phenomenon of ON voltage resulting from decreased distance between the FWD regions 2 may be prevented and since the number of the FWD regions 2 may be further increased by increasing the distances D1, D2, heat dissipation may be enhanced.

Further, for example, in industrial applications (inverters, etc.), the FWD may also turn on when the IGBT is turned on by application of gate voltage of 15V or higher (a typical IGBT gate threshold voltage). In this case, a problem arises in that electron current of the FWD passes through a channel (n-type inversion layer) of the IGBT adjacent to the FWD and forward characteristics of the FWD degrade. Such mutual interference at the boundary of the IGBT and the FWD tends to occur more easily the narrower is a width (length parallel to the second direction Y (lateral direction)) w1 of the FWD region 2. Therefore, the width w1 of the FWD region 2 may be, for example, 50 µm or more. Further, a width (interval) w2 between the FWD regions 2 that are adjacent to each other along the second direction Y may be at least the width w1 of the FWD region 2 (w2≥w1). A reason for this is that when the width w2 between the FWD regions 2 that are adjacent to each other along the second direction Y is less than the width w1 of the FWD region 2, conductivity modulation is delayed by the snapback phenomenon.

Further, in the active region 11, a front electrode pad (not depicted) and a gate pad (electrode pad) 3 are disposed separated from each other. The front electrode pad, for example, covers the front surface of the semiconductor chip 10 and spans an entire portion other than a portion that is covered by the gate pad 3 of the active region 11. FIG. 1 depicts a case in which at the boundary between the active region 11 and the edge termination region 12, the gate pad 3 is disposed at one vertex of the active region 11. In this case, the front electrode pad, for example, has a substantially L-shaped planar shape opposing two continuous sides of the gate pad 3 that has a substantially rectangular planar shape.

As depicted in FIG. 2, the first and the second gate trenches 31, 32 are respectively disposed in the IGBT region 1 and the FWD region 2. The first and the second gate trenches 31, 32 are each disposed separated from each other in a striped shape on stripes that are of a same pitch and parallel to the first direction X. The first and the second gate trenches 31, 32 are disposed separated from each other. The first and the second gate trenches 31, 32 that are adjacent to each other along the first direction X have respective ends that along the first direction X, oppose each other across a boundary region 15 between the IGBT region 1 and the FWD region 2. The boundary region 15 is a region between the first and the second gate trenches 31, 32 along the first direction X and is a region that is for sustaining the breakdown voltage and disposed between the active region 11 and the edge termination region 12.

The first gate trenches 31 configuring the striped planar layout parallel to the first direction X may have a linear planar shape parallel to the first direction X, or may have a ring-shaped planar shape in which the ends of adjacent linear portions parallel to the first direction X are connected to each other. The second gate trenches 32 configuring the striped planar layout parallel to the first direction X may have a linear planar shape parallel to the first direction X, or may have a ring-shaped planar shape in which the ends of adjacent linear portions parallel to the first direction X are connected to each other.

Further, in the second direction Y, at least two of the first gate trenches 31 having a linear planar shape or at least one of the first gate trenches 31 having a ring-shaped planar shape are between the FWD regions 2 that are disposed separated from each other across the center portion 11e of the active region 11 by the distance D2 (refer to FIG. 1). In other words, at least two of the first gate trenches 31 having a linear planar shape or at least one of the first gate trenches 31 having a ring-shaped planar shape are between the second gate trenches 32 that respectively in the FWD regions 2 that are disposed separated from each other across the center portion 11e of the active region 11 by the distance D2, are nearest the IGBT region 1 along the second direction Y.

Between the ends of the first and the second gate trenches 31, 32 that are adjacent to each other along the first direction X, a p+-type contact region (seventh/ninth semiconductor region) 33 is provided in the boundary region 15 between the IGBT region 1 and the FWD region 2 so as to be contact with the ends of the first and the second gate trenches 31, 32. The p+-type contact region 33 has a linear planar shape that is parallel to the second direction Y. In the boundary region 15 between the IGBT region 1 and the FWD region 2, the pt-type contact region 33 is exposed at a contact hole 34a and forms a contact (electrical contact) with the front electrode 51 (refer to FIG. 4) that is at an emitter potential is formed.

Further, between the first gate trenches 31 that are adjacent to each other, between the second gate trenches 32 that are adjacent to each other, and between the first and the second gate trenches 31, 32, a contact hole 34b with the front electrode 51 is provided in a linear planar shape that extends along the first direction X. When the first and the second gate trenches 31, 32 have a ring-shaped planar shape, in respective regions (on an inner circumferential side of the first and the second gate trenches 31, 32) surrounded by the first and the second gate trenches 31, 32 having a ring-shaped planar shape, the contact hole 34b is further provided in a linear planar shape that extends along the first direction X.

As depicted in FIG. 3, ends of the first and the second gate trenches 31, 32, the ends nearest the edge termination region 12, extend into the edge termination region 12. The ends of the first gate trenches 31, the ends nearest the edge termination region 12 side, for example, extend further outward (closer to an edge of the semiconductor chip 10) than do the ends of the second gate trenches 32, the ends nearest the edge termination region 12. In the edge termination region 12, the polysilicon (poly-Si) layer 35 that is at the emitter potential of the IGBT is disposed so as to cover the ends of the second gate trenches 32, the ends nearest the edge termination region 12.

The polysilicon layer 35, for example, is disposed in a linear planar shape that extends along the second direction Y so as to oppose ends of all of the second gate trenches 32, the ends nearest the edge termination region 12. In FIG. 3, the polysilicon layer 35 is indicated by a fine dotted line. The polysilicon layer 35 is electrically connected to a second gate electrode 49 at the ends of the second gate trenches 32, the ends nearest the edge termination region 12. Further, near the ends of the second gate trenches 32, the ends nearest the edge termination region 12, the polysilicon layer 35 is electrically connected to a p-type well region 62 described hereinafter, via a contact hole 34c (refer to FIG. 5).

The contact hole 34c, for example, is provided in a linear planar shape that extends along the second direction Y so as to oppose ends of all of the second gate trenches 32, the ends nearest the edge termination region 12. Each contact hole 34c (three in FIG. 5) may be disposed in a striped planar layout that extends along the second direction Y. In the contact holes 34c, for example, a plug made of tungsten (W) is embedded. Therefore, a width of the contact holes 34c may be narrow. Provision of the contact holes 34c enables connection defects caused by, for example, mask misalignment between the polysilicon layer 35 and the p-type well region 62 to be prevented.

Further, in the edge termination region 12, a gate runner 36 that is at a gate potential of the IGBT is provided so as to cover ends of the first gate trenches 31, the ends nearest the edge termination region 12. The gate runner 36, for example, is formed of polysilicon. The gate runner 36 is disposed further outward toward the chip edge than is the polysilicon layer 35 and is separated from the polysilicon layer 35 that is at the emitter potential. The gate runner 36 surrounds a periphery of the active region 11. A first gate electrode 47 in each of the first gate trenches 31 is electrically connected to the gate runner 36, at the ends of the first gate trenches 31, the ends nearest the edge termination region 12. The gate runner 36 is electrically connected to the gate pad 3 (refer to FIG. 1). In FIG. 3, the gate runner 36 is indicated by a dotted line coarser than that of the polysilicon layer 35.

Figure 4:
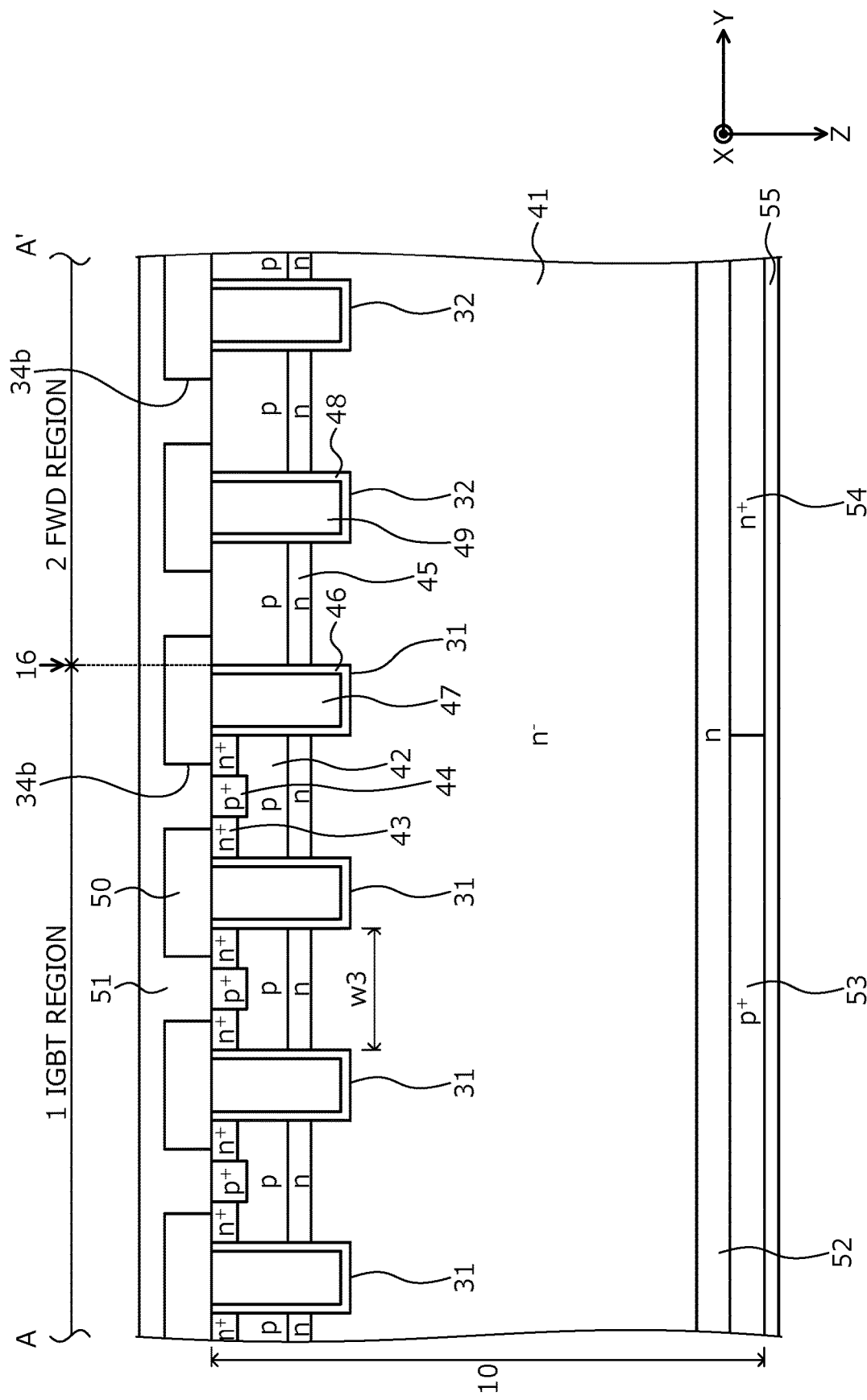
FIG. 4 is a cross-sectional view of a structure along cutting line A-A' in FIGS. 1 to 3.
Figure 5:
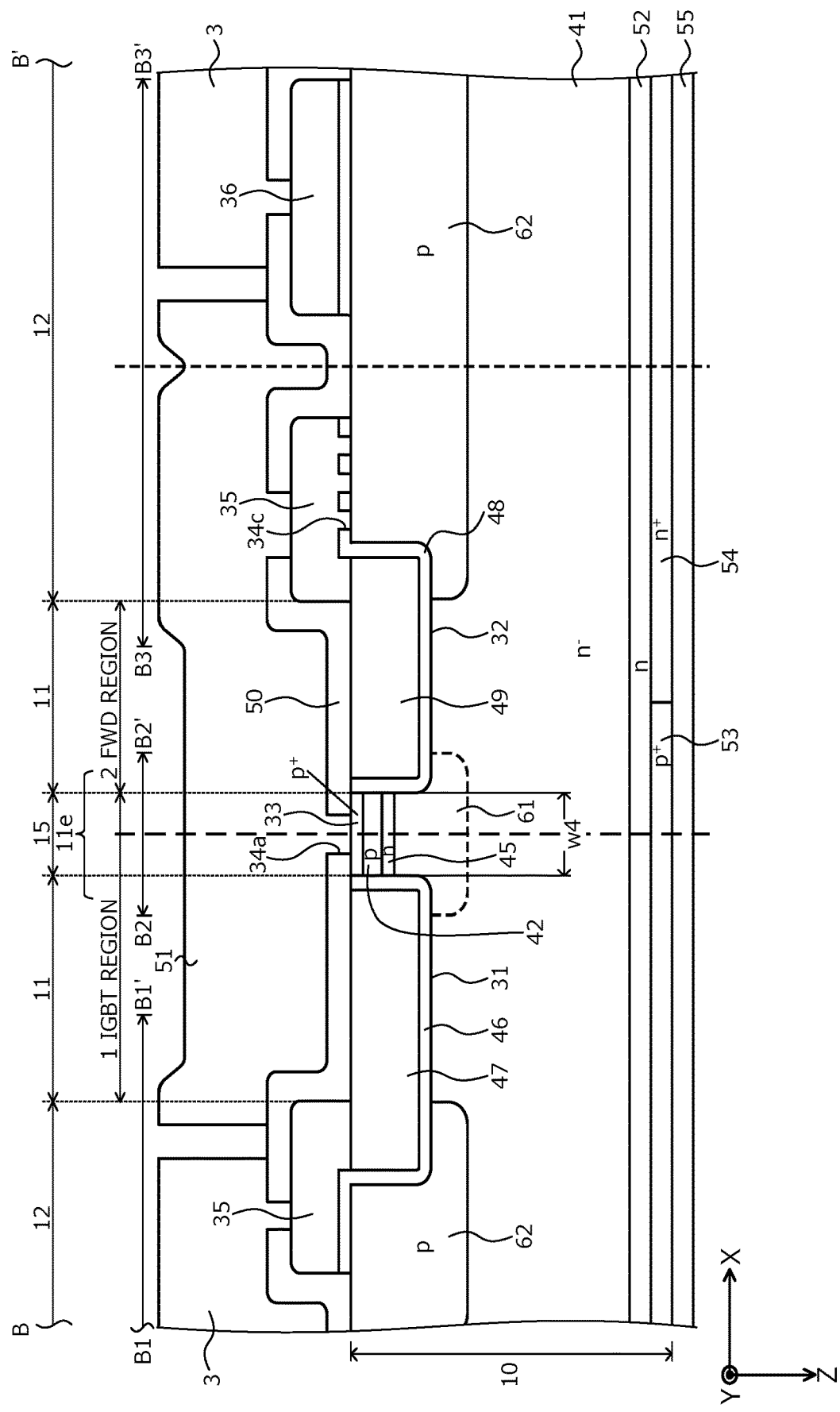
FIG. 5 is a cross-sectional view of the structure along cutting line B-B' in FIG. 1.

A cross-section of the structure of the semiconductor device according to the first embodiment will be described. FIG. 4 is a cross-sectional view of the structure along cutting line A-A' in FIGS. 1 to 3. FIG. 5 is a cross-sectional view of the structure along cutting line B-B' in FIG. 1. Cutting line B1-B1' and cutting line B3-B3' in FIG. 3 and cutting line B2-B2' in FIG. 2 are segments of cutting line B-B' in FIG. 1. First, a cross-section of the structure at a boundary 16 between the IGBT region 1 and the FWD region 2 along cutting line A-A' parallel to the second direction Y will be described with reference to FIG. 4.

As depicted in FIG. 4, in the semiconductor chip (semiconductor substrate) 10 that is an n$^-$-type and constitutes the n$^-$-type drift region 41, the IGBT region 1 and the FWD region 2 are disposed in parallel along the second direction Y. In the IGBT region 1, the p-type base region 42 is provided in a surface layer at the front surface of the semiconductor chip 10. A portion of the semiconductor chip 10 constitutes the n$^-$-type drift region 41, the portion being other than the p-type base region 42, an n-type carrier storage (CS) region (eighth semiconductor region) 45, an n-type field stop (FS) region (first semiconductor region) 52, a p$^+$-type collector region (fourth semiconductor region) 53 and an n$^+$-type cathode region (fifth semiconductor region) 54 each described hereinafter.

In the p-type base region 42, an n$^+$-type emitter region (third semiconductor region) 43 and the p$^+$-type contact region 44 are selectively provided so as to be in contact with each other. Between the p-type base region 42 and the n$^-$-type drift region 41, the n-type CS region 45 is provided. An impurity concentration of the n-type CS region 45 is higher than an impurity concentration of the n$^-$-type drift region 41 and lower than an impurity concentration of the n$^+$-type emitter region 43. The n-type CS region 45 has a function of storing holes when the IGBT is ON and a function of lowering surface resistance. Therefore, provision of the n-type CS region 45 enables ON resistance to be improved. The first gate trench 31 penetrates the n$^+$-type emitter region 43, the p-type base region 42 and the n-type CS region 45 from the front surface of the semiconductor chip 10 in a depth direction Z and reaches the n$^-$-type drift region 41. The depth direction Z is a direction from the front surface of the semiconductor chip 10 toward a rear surface.

In the first gate trench 31, the first gate electrode 47 is provided via the first gate insulating film 46. The first gate electrode 47 and the n$^+$-type emitter region 43 oppose each other across the first gate insulating film 46 at a side wall of the first gate trench 31. In FIG. 4, a case is depicted in which the n$^+$-type emitter region 43 is disposed only in a portion along the side wall of the first gate trench 31, and the p$^+$-type contact region 44 is disposed in a center portion between the first gate trenches 31 that are adjacent to each other. In this case, the n$^+$-type emitter region 43 and the p$^+$-type contact region 44 have a linear planar shape extending along the side wall of the first gate trench 31 in the first direction X.

While not depicted, between the first gate trenches 31 that are adjacent to each other, the n$^+$-type emitter region 43 and the p$^+$-type contact region 44 may be disposed to alternately repeat along the first direction X. In this case, the n$^+$-type emitter region 43 and the p$^+$-type contact region 44 oppose the first gate electrode 47, across the first gate insulating film 46 at the side wall of the first gate trench 31. Additionally, the first gate trench 31 penetrates the n$^+$-type emitter region 43, the p$^+$-type contact region 44, the p-type base region 42 and the n-type CS region 45 from the front surface of the semiconductor chip 10 in the depth direction Z and reaches the n$^-$-type drift region 41.

The p$^+$-type contact region 33 is formed in the boundary region 15 between the IGBT region 1 and the FWD region 2, so as to be exposed at the contact hole 34a in which a contact (electrical contact) with the front electrode 51 (refer to FIG. 4) that is at the emitter potential is formed. At a bottom surface of the p$^+$-type contact region 33, the p-type base region 42 described hereinafter is disposed. Further, at a bottom surface of the p-type base region 42, the n-type CS region 45 described hereinafter is disposed.

The front electrode 51 is in contact with the n$^+$-type emitter region 43 and the p$^+$-type contact region 44 via the contact hole 34b and is electrically connected to the n$^+$-type emitter region 43 and the p$^+$-type contact region 44. Further, the front electrode 51 is electrically insulated from the first gate electrode 47 by the interlayer insulating film 50. The front electrode 51 functions as the front electrode pad. The p-type base region 42, the interlayer insulating film 50, and the front electrode 51 are provided spanning the IGBT region 1 and the FWD region 2. In the FWD region 2, the n$^+$-type emitter region 43 and the p$^+$-type contact region 44 are not provided.

In the FWD region 2, the p-type base region 42 functions as a p-type anode region, and the front electrode 51 serves as an anode electrode. Further, in the FWD region 2, the second gate trench 32 is provided. The second gate trench 32 penetrates the p-type base region 42 and the n-type CS region 45 from the front surface of the semiconductor chip 10 in the depth direction Z and reaches the n$^-$-type drift region 41. Arrangement of the second gate trench 32, for example, is similar to arrangement of the first gate trench 31 in the IGBT region 1.

In the second gate trench 32, the second gate electrode 49 is provided via a second gate insulating film 48. The second gate electrode 49 is electrically separated from the first gate electrode 47. In other words, the p-type base region 42, the second gate trench 32, the second gate insulating film 48 and the second gate electrode 49 are provided in the FWD region 2 similarly to the p-type base region 42, the first gate trench 31, the first gate insulating film 46 and the first gate electrode 47 in the IGBT region 1.

The front electrode 51 is in contact with the p-type base region 42 via the contact hole 34b and is electrically connected to the p-type base region 42. The front electrode 51 is in contact with the p-type well region 62 described hereinafter, via the contact hole 34c and is electrically connected to the p-type well region 62. Further, the front electrode 51 is electrically connected to the second gate electrode 49 and the second gate electrode 49 is fixed at the emitter potential of the IGBT. The front electrode 51 is electrically insulated from the first gate electrode 47 by the interlayer insulating film 50.

In a surface layer at a rear surface of the semiconductor chip 10, the n-type FS region 52 is provided spanning the IGBT region 1 and the FWD region 2. The n-type FS region 52 has a function of suppressing the spreading of a depletion that spreads from a pn junction between the p-type base region 42 and the n$^-$-type drift region 41 when the IGBT is OFF. Further, in the surface layer at the rear surface of the semiconductor chip 10, at a position shallower than the n-type FS region 52 from the rear surface of the semiconductor chip 10, the p$^+$-type collector region 53 is provided in the IGBT region 1 and the n$^+$-type cathode region 54 is provided in the FWD region 2.

The p$^+$-type collector region 53 and the n$^+$-type cathode region 54, for example, are in contact with the n-type FS region 52. Further, the p$^+$-type collector region 53 and the n$^+$-type cathode region 54 are in contact with each other, and are disposed in parallel along a direction parallel to the rear surface of the semiconductor chip 10. A rear electrode (second electrode) 55 is provided at the rear surface of the semiconductor chip 10 overall, is in contact with the p$^+$-type collector region 53 and the n$^+$-type cathode region 54, and is electrically connected to the p$^+$-type collector region 53 and the n$^+$-type cathode region 54. The rear electrode 55 serves as a collector electrode and a cathode electrode.

A cross-section of the structure of the boundary region 15 between the IGBT region 1 and the FWD region 2 and inside the first and the second gate trenches 31, 32 along cutting line B-B' parallel to the first direction X will be described with reference to FIG. 5. As depicted in FIG. 5, in the boundary region 15 between the IGBT region 1 and the FWD region 2, the p-type base region 42 is provided in the surface layer at the front surface of the semiconductor chip 10. Additionally, the n-type CS region 45 is provided between the p-type base region 42 and the n$^-$-type drift region 41. The p$^+$-type contact region 33 is selectively provided in the p-type base region 42.

A width (i.e., a width of the boundary region 15 between the IGBT region 1 and the FWD region 2) w4 between the first and the second gate trenches 31, 32 along the first direction X may be equal to or less than a width (mesa width) w3 between the first gate trenches 31 that are adjacent to each other (w4≤w3). A reason for this is that when the width w4 of the boundary region 15 between the IGBT region 1 and the FWD region 2 exceeds the mesa width w3, the breakdown voltage decreases.

Instead of the p-type base region 42 and the n-type CS region 45, as indicated by a dashed line, a p-type well region (sixth semiconductor region) 61 that is at the emitter potential may be provided in the boundary region 15 between the IGBT region 1 and the FWD region 2. In this case, even when the width w4 of the boundary region 15 between the IGBT region 1 and the FWD region 2 is wider than the mesa width w3, decreases in the breakdown voltage do not occur. Therefore, the width w4 of the boundary region 15 between the IGBT region 1 and the FWD region 2 may be wider than the mesa width w3.

The p-type well region 61 reaches a position that is deeper than are the first and the second gate trenches 31, 32 from the front surface of the semiconductor chip 10. Further, the p-type well region 61 is provided spanning from ends of the side walls of the first and the second gate trenches 31, 32, the ends opposing each other across the boundary region 15, to a bottom surface, and covers bottom corners of the first and the second gate trenches 31, 32. The bottom corners of the first and the second gate trenches 31, 32 are boundaries between the side walls and the bottom surfaces of the first and the second gate trenches 31, 32.

Ends of the first and the second gate trenches 31, 321, the ends nearest the edge termination region 12, as described above, extend into the edge termination region 12. In the edge termination region 12, the p-type well region 62 is provided in the surface layer at the front surface of the semiconductor chip 10, so as to be further outward toward the chip edge than are the first and the second gate trenches 31, 32 and to surround a periphery of the active region 11. The p-type well region 62 reaches a position that is deeper than are the first and the second gate trenches 31, 32 from the front surface of the semiconductor chip 10. Further, the p-type well region 62 is disposed spanning from ends of the side walls of the first and the second gate trenches 31, 32, the ends nearest the edge termination region 12, and covers the bottom corners.

Further, in the edge termination region 12, for example, a breakdown voltage structure (not depicted) such as a FLR is provided in the surface layer at the front surface of the semiconductor chip 10, so as to be further outward toward the chip edge than is the p-type well region 62. Further, in the edge termination region 12, the polysilicon layer 35 that is at the emitter potential and the gate runner 36 that is at a gate potential are provided separated from each other on the front surface of the semiconductor chip 10. The polysilicon layer 35 extends outward toward the chip edge from an end of the second gate trench 32, the end nearest the edge termination region 12, and opposes in the depth direction Z, a portion of the p-type well region 62, for example, across the second gate insulating film 48 (or the interlayer insulating film 50) on the front surface of the semiconductor chip 10.

The polysilicon layer 35 is in contact with the second gate electrode 49 in the second gate trench 32 and is electrically connected to the second gate electrode 49. Further, the polysilicon layer 35 is in contact with the p-type well region 62 via the contact hole 34c that penetrates the second gate insulating film 48 in the depth direction Z. The polysilicon layer 35 is electrically connected to the p-type well region 62. The gate runner 36 opposes in the depth direction Z, the p-type well region 62, for example, across the first and the second gate insulating films 46, 48 (or the interlayer insulating film 50) on the front surface of the semiconductor chip 10. Further, the polysilicon layer 35 is in contact with the second gate electrode 49 in the second gate trench 32, is electrically connected to the second gate electrode 49, and is electrically connected to the $p^+$-type contact region 33 of the boundary region 15 via the front electrode 51 and the contact hole 34a.

Further, the gate runner 36 covers a portion of an end of the first gate trench 31, the portion of the end that is nearest the edge termination region 12 and extending into the edge termination region 12. At the end of the first gate trench 31, the end nearest the edge termination region 12, the gate runner 36 is in contact with the first gate electrode 47 in the first gate trench 31 and is electrically connected to the first gate electrode 47. The IGBT region 1 is a region from an end of the gate runner 36 on an inner side (center portion side of the active region 11) of the gate runner 36, to the boundary region 15 between the IGBT region 1 and the FWD region 2. The FWD region 2 is a region from an end of the polysilicon layer 35 on an inner side of the polysilicon layer 35, to the boundary region 15 between the IGBT region 1 and the FWD region 2.

The front electrode 51 covers the active region 11 and the boundary region 15 between the IGBT region 1 and the FWD region 2 overall. Further, the front electrode 51 extends into the edge termination region 12 and covers the polysilicon layer 35 via the interlayer insulating film 50. The front electrode 51 is in contact with the polysilicon layer 35 via a contact hole that penetrates the interlayer insulating film 50 in a depth direction, and the front electrode 51 is electrically connected to the polysilicon layer 35. The gate pad 3 is disposed on the gate runner 36 via the interlayer insulating film 50. The gate pad 3 is in contact with the gate runner 36 via a contact hole that penetrates the interlayer insulating film 50 in the depth direction, and the gate pad 3 is electrically connected to the gate runner 36.

The $p^+$-type collector region 53 is provided spanning the boundary region 15 between the IGBT region 1 and the FWD region 2, from the IGBT region 1. Further, the $p^+$-type collector region 53 may extend into the FWD region 2 from the boundary region 15 between the IGBT region 1 and the FWD region 2, and in the depth direction Z, may oppose an end of the second gate trench 32, the end nearest the boundary region 15. A reason for this is that diffusion of electrons of the $n^+$-type cathode region 54 in the FWD region 2 easily induces holes from the $p^+$-type contact region 33 in the IGBT region 1, whereby SW loss easily degrades.

As described above, according to the first embodiment, in the active region, the FWD regions are disposed in plural separated from each other, and the IGBT region between the plural FWD regions is a continuous region. In particular, the FWD regions are disposed in a striped planar layout that extends from the boundary between the active region and the edge termination region, in a direction orthogonal to the boundary and terminates near the center portion of the active region; and a portion of the active region other than the FWD regions is the IGBT region. An equal number of the FWD regions are disposed on each side sandwiching the IGBT region. As a result, even when the semiconductor chip is to be reduced in size, the surface area ratio of the IGBT region and the FWD region is maintained, and the predetermined width of the FWD regions may be increased and the number of the FWD regions disposed in the active region may be increased.

For example, in the conventional structure in which both ends of the FWD regions reach the boundary between the active region and the edge termination region (refer to FIGS. 11, 12), when the surface area ratio of the IGBT region and the FWD region is given priority, the width or the number (count) of the FWD regions is limited. On the other hand, according to the first embodiment, the length of the FWD regions is adjusted, enabling the predetermined number of the FWD regions to be disposed having the predetermined width, whereby the degrees of freedom in design increases as compared to the conventional structure.

Further, for example, the width of the FWD regions is set to be 50 μm or more, whereby degradation of forward characteristics of the FWD during application of gate voltage of 15V or higher (a typical IGBT gate threshold voltage) may be set to be in an acceptable range. Further, for example, the width of the FWD regions is 400 μm or more, whereby degradation of forward characteristics of the FWD during application of gate voltage of 15V or higher, which is a typical IGBT gate threshold voltage, may be prevented.

Further, the number of the FWD regions is increased, enabling heat dissipation of the FWD to be enhanced. In an instance of the same chip size and the same surface area ratio between the IGBT region and the FWD regions as in the conventional structure, the amount of heat generated in the semiconductor chip overall may be reduced about 20% to 30% as compared to the conventional structure.

Further, according to the first embodiment, as compared to the conventional structure, the length of the FWD regions is shortened, whereby the adjacent arrangement of the IGBT region and the FWD regions becomes smaller. For example, as depicted in FIG. 1, when the FWD regions are disposed having a length that does not reach the center portion of the active region from the boundary between the active region and the edge termination region, only the IGBT is disposed in the center portion of the active region. Therefore, mutual interference between the IGBT and the FWDs may be suppressed.

Further, according to the first embodiment, the FWD region on one side of one pair of opposing sides of the active region and the FWD region on the other side of the one pair of opposing sides of the active region are disposed at mutually differing positions, thereby enabling the gate electrodes of the IGBT to be connected to the gate runner at the positions of the ends of the first gate trenches, the gate runner surrounding a periphery of the active region. Therefore, connection of the gate runner and the gate electrodes of the IGBT is facilitated.

Figure 7A:
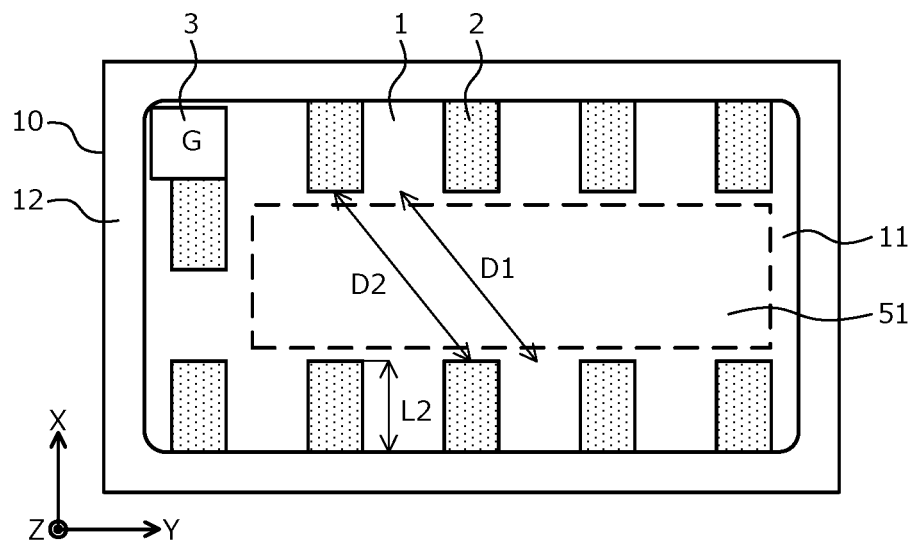
FIG. 7A is a plan view depicting a planar layout of the semiconductor device according to a second embodiment.
Figure 7B:
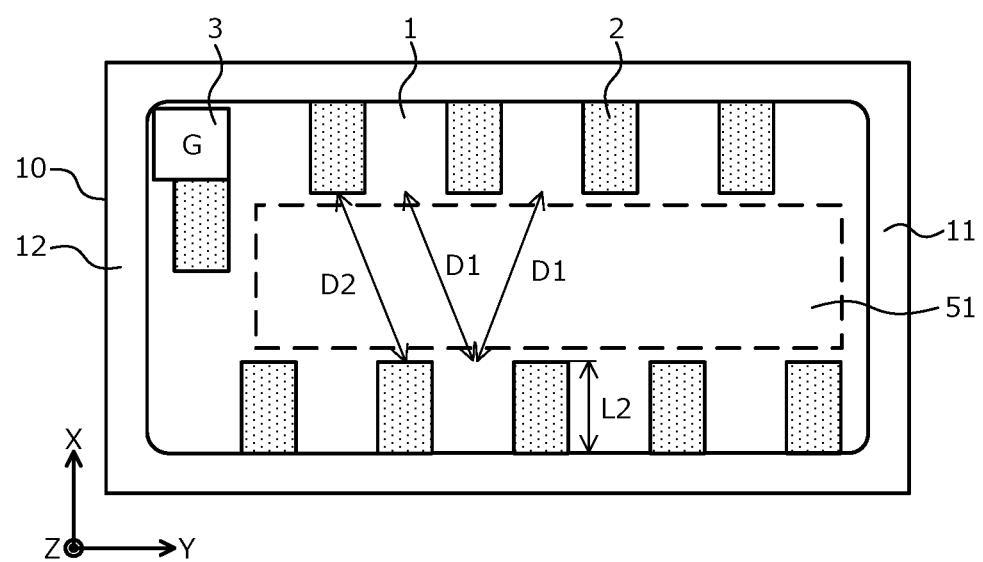
FIG. 7B is a plan view depicting a planar layout of the semiconductor device according to a second embodiment.
Figure 7C:
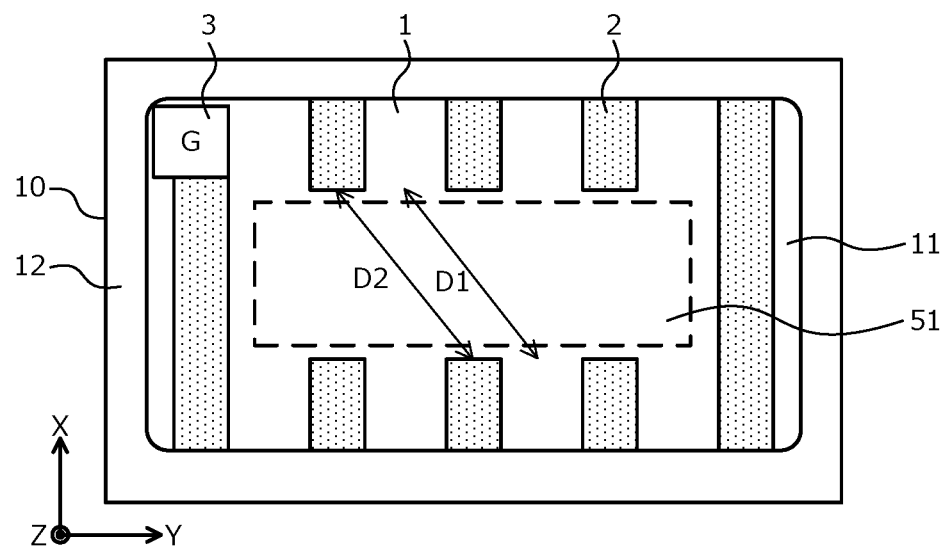
FIG. 7C is a plan view depicting a planar layout of the semiconductor device according to a second embodiment.

A structure of the semiconductor device according to a second embodiment will be described. FIGS. 7A, 7B, and 7C are plan views depicting planar layouts of the semiconductor device according to the second embodiment. The semiconductor device according to the second embodiment differs from the semiconductor device according to the first embodiment in that the length L2 of the FWD region 2 is shorter. FIG. 7A depicts a state in which the FWD regions 2 are disposed opposing each other along the first direction X. FIG. 7B depicts a state in which, similarly to the first embodiment, the FWD regions 2 are disposed not opposing each other along the first direction X.

FIG. 7C depicts a state in which, similarly to FIG. 7A, the FWD regions 2 oppose each other along the first direction X. Further, the FWD regions 2 disposed at both ends (ends in the second direction Y) of the active region 11 are disposed connected to the opposing FWD region 2 in the longitudinal direction (the first direction X). The number of the FWD regions 2 is determined by the surface area ratio of the IGBT region 1 and the FWD region 2. A cross-section of the structure of the IGBT region 1 and the FWD region 2 is similar to that of the first embodiment except that the FWD region 2 is not provided beneath the front electrode 51 as described hereinafter.

Shortening of the length L2 of the FWD region 2 enables the distance D1 between portions separated from each other along a direction that is oblique to the first direction X and the distance D2 between the FWD regions 2 separated from each other along a direction that is oblique to the first direction X may be further increased in IGBT region. Therefore, the FWD region 2 is not disposed beneath the front electrode 51 of the center portion of the semiconductor chip 10. A bonding wire (not depicted) is connected to the front electrode 51. The FWD regions 2 and a bonding surface of the bonding wire that is connected to the front electrode 51 may be separated from each other by a certain distance. The bonding surface of the bonding wire and the FWD regions 2 are separated from each other by a certain distance, thereby enabling heat generation of the FWD regions 2 to be suppressed. Further, the FWD regions 2 and the bonding surface of the bonding wire are separated from each other by a certain distance, whereby sheet resistance of the front electrode 51 between the bonding surface of the bonding wire and the FWD regions 2 increases, enabling degradation of heat dissipation due to current concentration of the FWD regions 2 to be prevented.

Further, according to the second embodiment, effects similar to those of the first embodiment may be obtained. Further, according to the second embodiment, the length of the FWD regions is reduced, thereby enabling heat generation of the FWD regions to be further suppressed.

A structure of the semiconductor device according to a third embodiment will be described. FIG. 8 is a plan view depicting a planar layout of the semiconductor device according to the third embodiment. The semiconductor device according to the third embodiment is the semiconductor device according to the first embodiment to which an IGBT (sense IGBT) for detecting/controlling current is applied.

In particular, as depicted in FIG. 8, in the active region 11, other than the IGBT of an IGBT region 71 and a FWD of a FWD region 72, a current sense portion, a temperature sense portion and an overvoltage protection portion are provided.

The current sense portion (not depicted) is a vertical metal oxide semiconductor field effect transistor (MOSFET) and has a function of detecting overcurrent (OC) flowing in the IGBT of the IGBT region 71. A source electrode of the current sense portion functions as a sense pad (hereinafter, OC pad) 76 for current sensing. The current sense portion, for example, is disposed beneath (portion opposing in the depth direction Z) the OC pad 76.

The temperature sense portion (not depicted) is a diode and has a function of detecting temperature of the IGBT of the IGBT region 1, by using temperature characteristics of the diode. An anode electrode and cathode electrode of the temperature sense portion server as an anode pad 74 and a cathode pad 75, respectively. The temperature sense portion, for example, is disposed directly beneath the anode pad 74 and the cathode pad 75. The overvoltage protection portion (not depicted) is a diode and, for example, protects the IGBT of the IGBT region 71 from overvoltage (OV) such as surges. An anode electrode of the overvoltage protection portion serves as a sense pad (hereinafter, OV pad) 77 for overvoltage protection. The overvoltage protection portion, for example, is disposed directly beneath the OV pad 77.

The temperature sense portion and the overvoltage protection portion, for example, may be a horizontal diode configured by a pn junction between a p-type polysilicon layer and an n-type polysilicon layer provided on the semiconductor chip 10 via an insulating film, or may be a vertical diode configured by a pn junction between a p-type diffusion region and an n-type diffusion region disposed in the semiconductor chip 10. Electrode pads such as the front electrode pad (not depicted) and a gate pad 73 of the IGBT, the anode pad 74 and the cathode pad 75 of the temperature sense portion, the OC pad 76 of the current sense portion, and the OV pad 77 of the overvoltage protection portion, are disposed in the IGBT region 71, separated from the FWD regions 72 on the front surface of the semiconductor chip 10.

In FIG. 8, while a case is depicted in which near the boundary of the active region 11 and the edge termination region 12, the gate pad 73, the anode pad 74, the cathode pad 75 and the OC pad 76 are disposed along the side 11b of the active region 11 orthogonal to the stripe of the FWD region 72; and the OV pad 77 is disposed near the center portion 11e of the active region 11, arrangement of these electrode pads may be variously changed. Configuration of the IGBT region 71 and the FWD regions 72 is similar to that in the first embodiment, except for the differing arrangement of the FWD regions 72 and the gate pad 73, and the differing planar shape of the front electrode pad (not depicted).

The front electrode 51 (refer to FIG. 4) of the IGBT of the IGBT region 71 is electrically connected to the cathode electrode of the temperature sense portion and the anode electrode of the overvoltage protection portion. The FWD regions 72, for example, are disposed in a striped planar layout extending toward the center portion 11e of the active region 11, from the side 11a of the active region 11, the side 11a orthogonal to the side 11b where the gate pad 73, etc. are disposed; and the FWD regions 72 terminate near the center portion 11e of the active region 11. The IGBT region 71, similarly to the first embodiment, is a region of the active region 11 other than the FWD regions 72.

Figure 12:
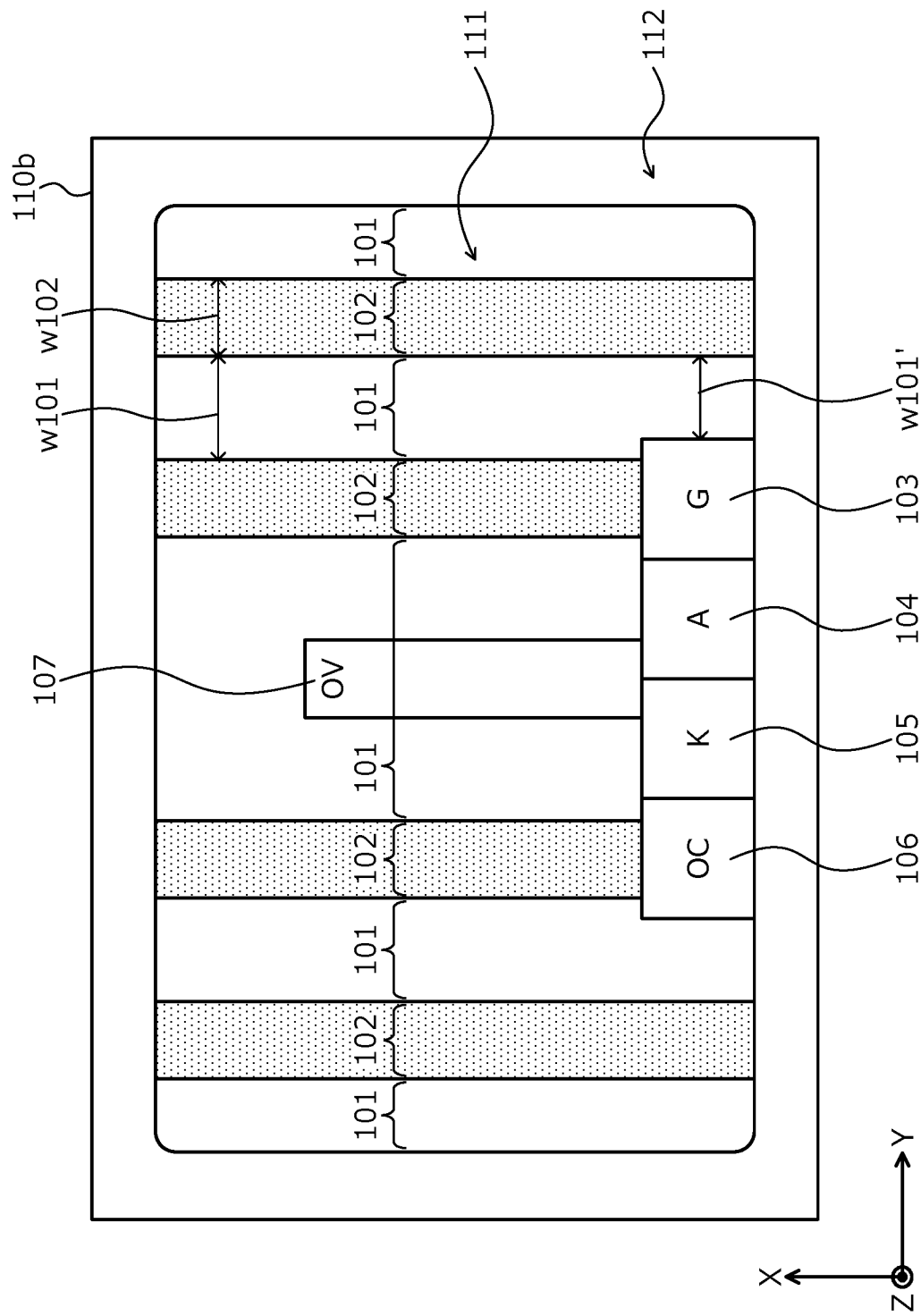
FIG. 12 is a plan view of an example of a planar layout of a conventional semiconductor device.

For example, both ends of the FWD region 102 disposed in a striped-shape layout are assumed to reach the boundary between the active region 111 and the edge termination region 112 like in the conventional structure (refer to FIG. 12). In this case, at portions where the gate pad 103 and the sense pads 104 to 107 are disposed, the width w101 of the IGBT region 101' becomes narrower and IGBT operation may be inhibited. On the other hand, in the present invention, the length L2 of the FWD region 72 is shortened, and the FWD region 72 is disposed in a planar layout that terminates near the center portion 11e of the active region 11, thereby enabling a wide width of the IGBT region 71 to be established, whereby degradation of IGBT characteristics may be prevented.

Further, in the present invention, the length L2 of the FWD region 72 is shortened and the FWD region 72 is disposed in a planar layout that terminates near the center portion 11e of the active region 11, thereby enabling the FWD regions 72 to be disposed separated from the gate pad 7 and the sense pads 74 to 77. As a result, the FWD region 72 may be disposed having the width w1 that is wide. The increased width w1 of the FWD regions 72 enables thermal resistance at the FWD regions 72 to be decreased and degradation of forward characteristics and recovery characteristics of the FWD to be prevented.

As described above, according to the third embodiment, effects similar to those of the first embodiment may be obtained. Further, according to the third embodiment, degradation of IGBT characteristics and FWD characteristics may be prevented.

A structure of the semiconductor device according to a fourth embodiment will be described. FIG. 9 is a plan view depicting a planar layout of the semiconductor device according to the fourth embodiment. The semiconductor device according to the fourth embodiment differs from the semiconductor device according to the third embodiment in that the width w1 of the FWD regions 72 is reduced and heat dissipation of the FWD regions 72 is enhanced. For example, the number of the FWD regions 72 is increased corresponding to the extent to which the width w1 of the FWD regions 72 is reduced, thereby enabling a total surface area of the FWD regions 72 to be maintained at a predetermined size (for example, about equal to a total surface area the FWD regions 102 of the conventional structure).

The electrode pads such as the front electrode pad (not depicted) and the gate pad 73 of the IGBT, the anode pad 74 and the cathode pad 75 of the temperature sense portion, the OC pad 76 of the current sense portion, the OV pad 77 of the overvoltage protection portion, etc. may be disposed on the FWD regions 72 so as to span the FWD regions 72 from the IGBT region 71. In FIG. 9, portions of the FWD region 72 covered by the electrode pad are indicated by dotted lines. In this case, the temperature sense portion and the overvoltage protection portion may be a vertical diode configured using a portion of the FWD of the FWD region 72.

As described above, according to the fourth embodiment, effects similar to those of the first and the second embodiments may be obtained. Further, according to the fourth embodiment, the width of FWD regions is reduced and the FWD regions are dispersed, whereby as compared to a case where one FWD region is disposed in the active region, the heat generated by the FWD regions is suppressed, enabling heat dissipation of the FWD regions to be enhanced.

A structure of the semiconductor device according to a fifth embodiment will be described. FIG. 10 is a plan view depicting a planar layout of the semiconductor device according to the fifth embodiment. The semiconductor device according to the fifth embodiment differs from the semiconductor device according to the first embodiment in that a portion of a FWD region 82 on the side 11a of the active region 11 and a portion of a FWD region 82 on the side 11b oppose each other along the second direction Y. An IGBT region 81, similarly to the first embodiment, is a region of the active region 11 other than the FWD regions 82.

In particular, the FWD regions 82 extend from the side 11a (or the side 11b) of the opposing sides 11a, 11b of the active region 11, toward the side 11b (or the side 11a) and extend beyond the center portion 11e of the active region 11. A distance w5 between an end of the FWD region 82, the end extending toward the side 11b (or the side 11a) and the side 11b (or the side 11a) may be equal to more than the width w1 of the FWD region 82 (w5≥w1). A portion of the FWD region 82 extending from the side 11a of the active region 11 (the portion nearest the side 11b) and a portion of the FWD region 82 extending from the side 11b (the portion nearest the side 11a) oppose each along the second direction Y.

As described above, according to the fifth embodiment, even when the length of FWD region is increased, effects similar to those of the first to the third embodiments may be obtained provided that an end of the FWD region does not reach the boundary between the active region and edge termination region.

The present invention is not limited to the embodiments described above and various modifications with in a range not departing from the spirit of the invention are possible. For example, in the embodiments described above, while a case in which the FWD region is disposed in a striped planar layout parallel to the short sides of active region that has a substantially rectangular shape is described as an example, the FWD region may be disposed in a striped planar layout parallel to the long sides of the active region that has a substantially rectangular shape. Further, the number of FWD regions may be an even number or may be an odd number. Further, in the embodiments described above, while a case of a small-chip IGBT is described as an example, application is further possible in a case of large chip size, and when the surface area of the FWD region is reduced, similar effects are achieved. Further, the present invention is similarly implemented when conductive types (n-type, p-type) are reversed.

According to the present invention described above, while a surface area ratio of a first element region and second element regions is maintained, a predetermined width of each of the second element regions may be increased and the number of the second element regions disposed in the active region may be increased.

The semiconductor device according to the present invention achieves an effect in that degradation of element characteristics is prevented, or heat dissipation of the semiconductor chip may be enhanced. The semiconductor device according to the present invention further achieves an effect in that the degrees of freedom in design may be enhanced.

As described above, the semiconductor device according to the present invention is useful in 600V or higher semiconductor devices used in power converting equipment such as inverters, in power supply devices such as in various types of industrial machines, and in automotive igniters etc., and is particularly suitable for RC-IGBTs used in inverters, intelligent power modules (IPMs), etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate; and
   an active region through which current flows, provided on the semiconductor substrate, the active region including a first element region and a plurality of second element regions, wherein
   the first element region includes a first element having a first trench gate structure, the first trench gate structure including
      a first trench provided on a first main surface side of the semiconductor substrate, and
      a first gate electrode provided in the first trench via a first gate insulating film,
   the plurality of second element regions each include a second element having a second trench gate structure, the second trench gate structure including
      a second trench provided on the first main surface side of the semiconductor substrate, separated from the first trench, and
      a second gate electrode provided in the second trench via a second gate insulating film,
   the second element regions being spaced apart from each other, the first element region being a single continuous region and being disposed in a part of the active region, the part of the active region being free of the second element regions,
   the active region has a rectangular outer periphery including a first side extending in a first direction and a second side opposite to the first side,
   each second element region is disposed in a striped-shape layout that is parallel to a first main surface of the semiconductor substrate, and
   the plurality of second element regions include a plurality of first second-element-regions and a plurality of second second-element-regions,
      the first second-element-regions extending from the first side toward the second side in the first direction,
      the second second-element-regions extending from the second side toward the first side in the first direction,
      each of the first second-element-regions being disposed at a position different from each of the second second-element-regions along a second direction orthogonal to the first direction, and
      a total number of the first second-element-regions and a total number of the second second-element-regions are the same.

2. The semiconductor device according to claim 1, wherein each second element region is disposed near an outer periphery of the active region.

3. The semiconductor device according to claim 1, wherein a first length of said each second element region along the first direction is longer than a second length of said each second element region along the second direction.

4. The semiconductor device according to claim 1, wherein a distance between adjacent two second element regions in the second direction is equal to or greater than the second length of said each second element region along the second direction.

5. The semiconductor device according to claim 1, wherein the second length of said each second element region along the second direction is at least 50 μm.

6. The semiconductor device according to claim 1, wherein
   the first element further includes:
      a first semiconductor region of a first conductivity type provided on the semiconductor substrate;
      a second semiconductor region of a second conductivity type provided in a surface layer at the first main surface of the semiconductor substrate, the second semiconductor region being in contact with the first semiconductor region;
      a third semiconductor region of the first conductivity type selectively provided in the second semiconductor region;
      a fourth semiconductor region of the second conductivity type provided in a surface layer at a second main surface of the semiconductor substrate, the fourth semiconductor region being in contact with the first semiconductor region;
      a first electrode in contact with the second semiconductor region and the third semiconductor region; and
      a second electrode in contact with the fourth semiconductor region, and
   the first trench penetrates the third semiconductor region and the second semiconductor region, and reaches the first semiconductor region,
   the second element further includes:
      the first semiconductor region and the second semiconductor region extending from the first element region to said each second element region;
      a fifth semiconductor region of the first conductivity type provided in the surface layer at the second main surface of the semiconductor substrate,
   the fifth semiconductor region being in contact with the first semiconductor region and the fourth semiconductor region;
      the first electrode in contact with the second semiconductor region; and
      the second electrode in contact with the fifth semiconductor region, and
   the second trench penetrates the second semiconductor region and reaches the first semiconductor region, and
   the second gate electrode is in contact with the fifth semiconductor region.

7. The semiconductor device according to claim 1, wherein
   the first trench includes a plurality of first trenches each having two ends, each first trench extending in a direction parallel to the first main surface of the semiconductor substrate and being disposed in a striped-shape layout extending in the first direction,
   the second trench includes a plurality of second trenches each having two ends, each second trench extending in a direction parallel to the first main surface of the semiconductor substrate and being disposed in a striped-shape layout extending in the first direction,
   one of the two ends of one of the first trenches facing one of the two ends of a corresponding one of the second trenches along the first direction, and
   the semiconductor device further comprising a sixth semiconductor region of the second conductivity type provided between and contacting the one of the two end of the one of the first trenches and the one of the two ends of the corresponding one of the second trenches.

8. The semiconductor device according to claim 6, wherein
   the first trench includes a plurality of first trenches each having two ends, each first trench extending in a direction parallel to the first main surface of the semiconductor substrate and being disposed in a striped-shape layout extending in the first direction, the second trench includes a plurality of second trenches each having two ends, each second trench extending in a direction parallel to the first main surface of the semiconductor substrate and being disposed in a striped-shape layout extending in the first direction, one of the two ends of one of the first trenches facing one of the two ends of a corresponding one of the second trenches along the first direction, and the semiconductor device further comprising a sixth semiconductor region of the second conductivity type provided between and contacting the one of the two end of the one of the first trenches and the one of the two ends of the corresponding one of the second trenches.

9. The semiconductor device according to claim 7, wherein a depth of the sixth semiconductor region is greater than a depth of the first trench and a depth of the second trench.

10. The semiconductor device according to claim 6, further comprising
a boundary region between the first element region and one of the second element regions, wherein
the boundary region includes the first semiconductor region having a surface layer in which the second semiconductor region is disposed.

11. The semiconductor device according to claim 10, wherein the second semiconductor region in the boundary region further includes
a seventh semiconductor region of the second conductivity type disposed in the surface layer of the second semiconductor region, the seventh semiconductor region having an impurity concentration higher than an impurity concentration of the second semiconductor region; and
an eighth semiconductor region of the first conductivity type disposed at a bottom surface of the second semiconductor region, the eighth semiconductor region having an impurity concentration higher than an impurity concentration of the first semiconductor region.

12. The semiconductor device according to claim 11, wherein the seventh semiconductor region is electrically connected to the second gate electrode.

13. The semiconductor device according to claim 8, further comprising
a boundary region between the first element region and one of the second element regions, wherein
the boundary region further includes
the sixth semiconductor region, the six semiconductor region being provided in the surface layer of the first semiconductor region and covering bottoms of the first trench and a corresponding one of the second trenches, and
a ninth semiconductor region of the second conductivity type provided in a surface layer of the sixth semiconductor region, the ninth semiconductor region having an impurity concentration higher than an impurity concentration of the sixth semiconductor region.

14. The semiconductor device according to claim 13, wherein the ninth semiconductor region is electrically connected to the second gate electrode.

15. The semiconductor device according to claim 1, further comprising
an edge termination region provided between the active region and an edge of the semiconductor substrate in plan view of the semiconductor device, the edge termination region surrounding a periphery of the active region, wherein
the active region has a rectangular outer periphery including a first pair of opposing sides in a first direction and a second pair of opposing sides in a second direction orthogonal to the first direction,
each second element region is disposed in a striped-shape layout that is parallel to a first main surface of the semiconductor substrate, and extends from one of the first pairs of opposing sides toward the other one of the first pair of opposing sides along the second direction, and
the outer periphery of the active region is a boundary between the active region and the edge termination region.

16. The semiconductor device according to claim 6, further comprising:
an edge termination region provided between the active region and an edge of the semiconductor substrate in plan view of the semiconductor device, the edge termination region surrounding a periphery of the active region, wherein
the active region has a rectangular outer periphery including a first pair of opposing sides in a first direction and a second pair of opposing sides in a second direction orthogonal to the first direction,
each second element region is disposed in a striped-shape layout that is parallel to a first main surface of the semiconductor substrate, and extends from one of the first pairs of opposing sides toward the other one of the first pair of opposing sides along the second direction, and
the outer periphery of the active region is a boundary between the active region and the edge termination region.

17. The semiconductor device according to claim 1, wherein
the first element region is an insulated gate bipolar transistor, and
each of the plurality of second element regions is a free wheeling diode.

* * * * *